US012463091B2

(12) United States Patent
Pan et al.

(10) Patent No.: US 12,463,091 B2
(45) Date of Patent: *Nov. 4, 2025

(54) METHODS OF FORMING SEMICONDUCTOR DEVICE STRUCTURES

(71) Applicant: TAIWAN SEMICONDUCTOR MANUFACTURING COMPANY, LTD., Hsinchu (TW)

(72) Inventors: Yi-Wen Pan, New Taipei (TW); You-Lan Li, Hsinchu (TW); Chung-Chi Ko, Nantou (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/406,151

(22) Filed: Jan. 6, 2024

(65) Prior Publication Data

US 2024/0153814 A1    May 9, 2024

Related U.S. Application Data

(63) Continuation of application No. 17/406,920, filed on Aug. 19, 2021, now Pat. No. 11,901,219.

(51) Int. Cl.
*H01L 21/768* (2006.01)
*H01L 21/762* (2006.01)
*H10D 84/01* (2025.01)
*H10D 84/03* (2025.01)

(52) U.S. Cl.
CPC .. *H01L 21/76814* (2013.01); *H01L 21/76224* (2013.01); *H01L 21/76877* (2013.01); *H10D 84/0149* (2025.01); *H10D 84/0158* (2025.01); *H10D 84/038* (2025.01)

(58) Field of Classification Search
CPC ......... H01L 21/76814; H01L 21/76825; H01L 21/76224; H01L 21/76877; H01L 21/823431; H01L 21/823821; H01L 21/823475; H01L 21/76897; H01L 21/76802; H01L 21/823871; H10D 84/0158; H10D 84/0193; H10D 84/0149; H10D 84/0186

See application file for complete search history.

(56) References Cited

U.S. PATENT DOCUMENTS

| | | |
|---|---|---|
| 7,851,232 B2 | 12/2010 | Van Schravendijk et al. |
| 8,242,028 B1 | 8/2012 | Van Schravendijk et al. |
| 8,465,991 B2 | 6/2013 | Varadarajan et al. |
| 9,006,056 B2 | 4/2015 | Yao et al. |
| 9,728,402 B2 | 8/2017 | Wang et al. |
| 10,037,905 B2 | 7/2018 | Varadarajan et al. |
| 11,522,062 B2 | 12/2022 | More et al. |

(Continued)

*Primary Examiner* — Bac H Au
(74) *Attorney, Agent, or Firm* — NZ Carr Law Office

(57) ABSTRACT

Methods of forming a semiconductor device structure are described. In some embodiments, the method includes forming an interconnect structure over a substrate. The forming the interconnect structure over the semiconductor device structure includes forming a dielectric layer, then performing an annealing process, then forming one or more openings in the dielectric layer, then performing a first ultraviolet (UV) curing process, and then forming conductive features in the one or more openings.

20 Claims, 20 Drawing Sheets

(56) References Cited

U.S. PATENT DOCUMENTS

| | | |
|---|---|---|
| 11,901,219 B2 * | 2/2024 | Pan ................ H01L 21/823475 |
| 2008/0182379 A1 | 7/2008 | Smith et al. |
| 2009/0137111 A1 | 5/2009 | Lee et al. |
| 2010/0227471 A1 | 9/2010 | Leung et al. |
| 2011/0312191 A1 | 12/2011 | Ohkura et al. |
| 2013/0193541 A1 | 8/2013 | Sun et al. |
| 2014/0217589 A1 | 8/2014 | Liou et al. |
| 2016/0197043 A1 | 7/2016 | Liou et al. |
| 2018/0190658 A1 | 7/2018 | Chen et al. |
| 2018/0337088 A1 | 11/2018 | Hsiao et al. |
| 2018/0350693 A1 | 12/2018 | Huang et al. |
| 2019/0006228 A1 | 1/2019 | Huang et al. |
| 2019/0371736 A1 | 12/2019 | Singh et al. |
| 2021/0166978 A1 | 6/2021 | Chen et al. |
| 2021/0193566 A1 | 6/2021 | Lo et al. |

\* cited by examiner

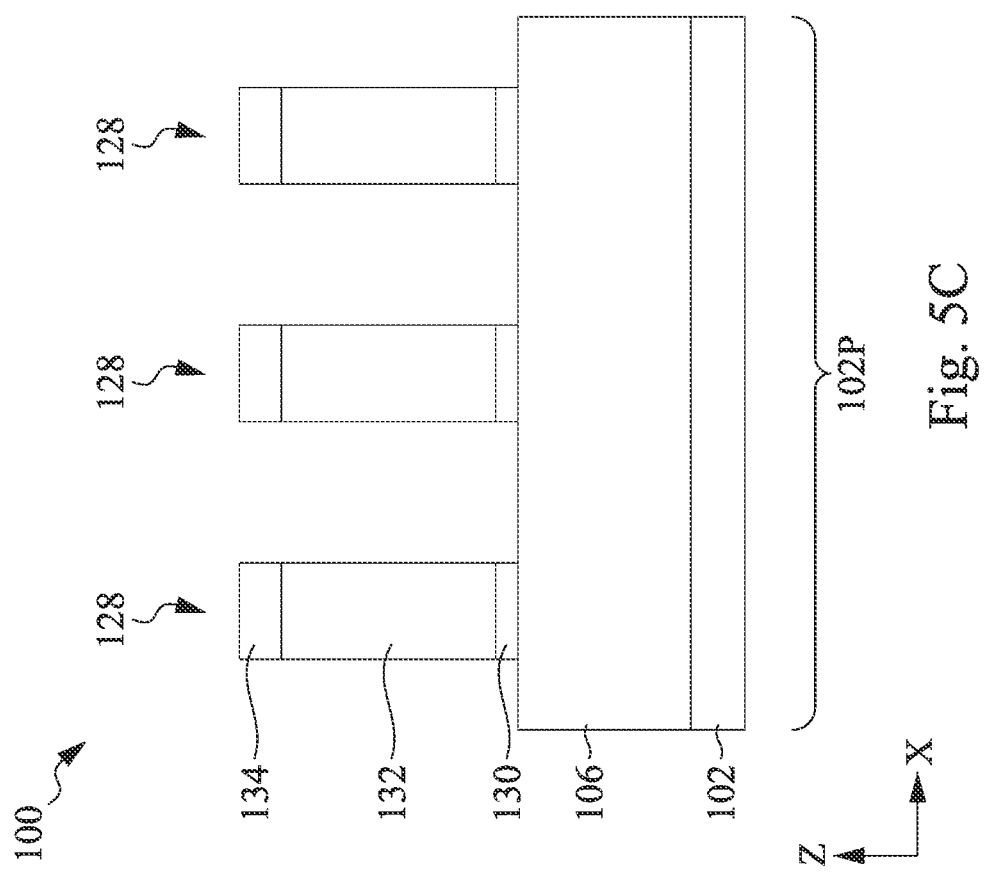

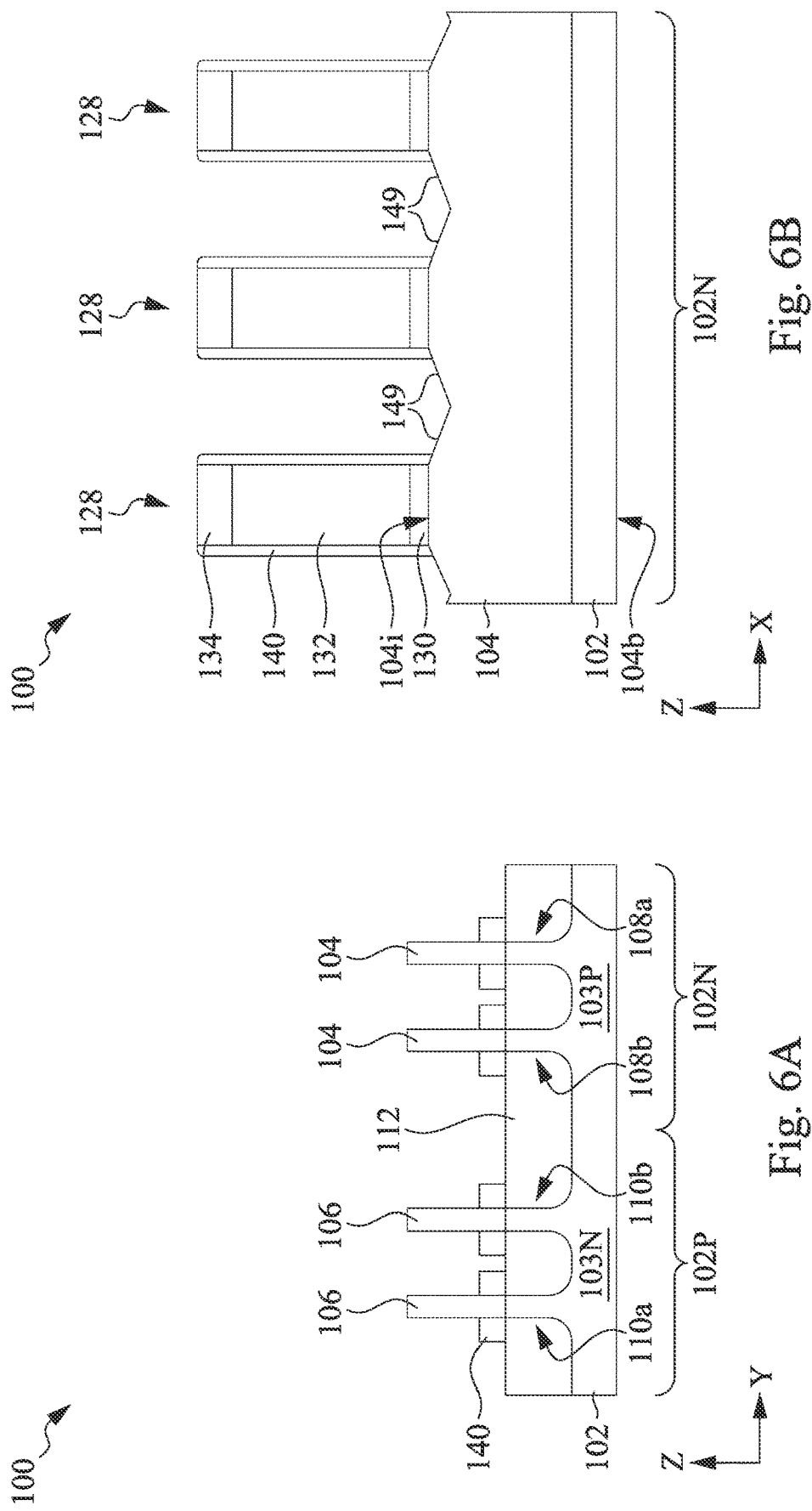

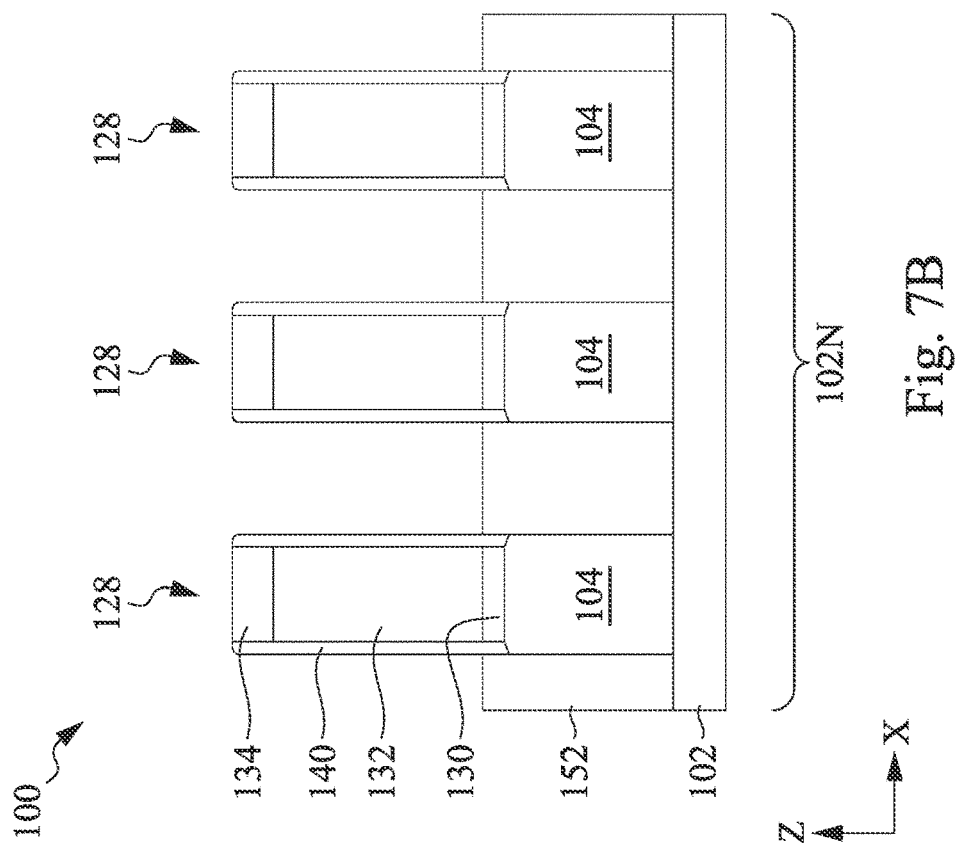
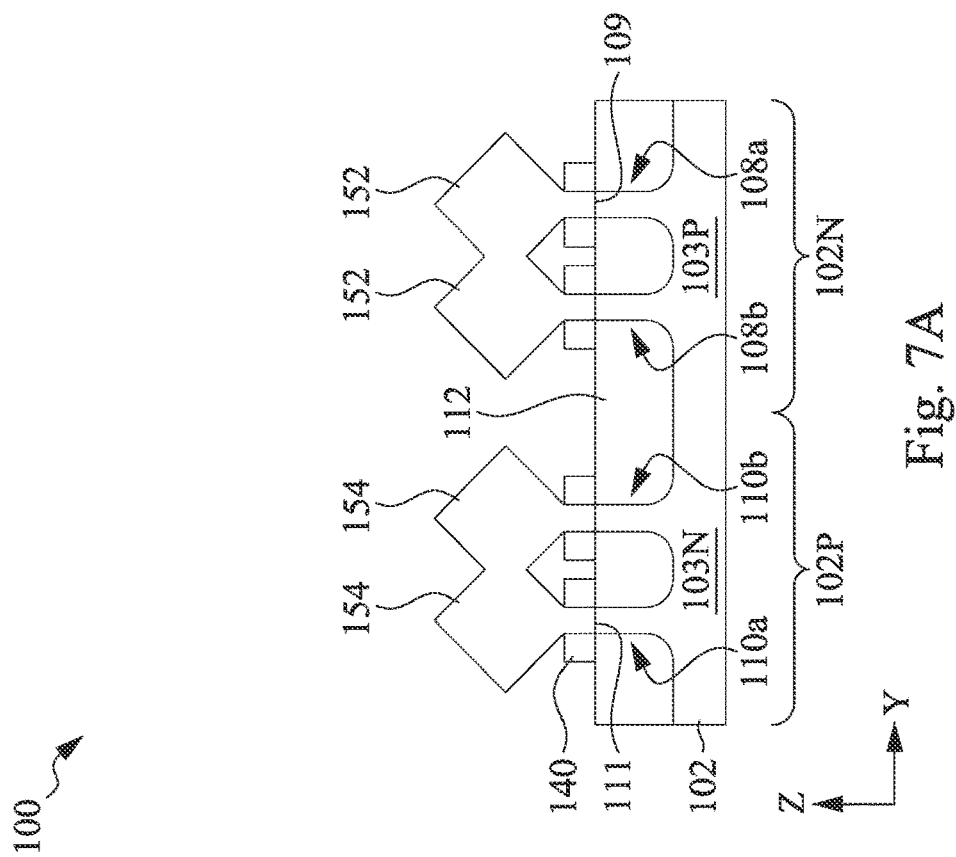
Fig. 7B
Fig. 7A

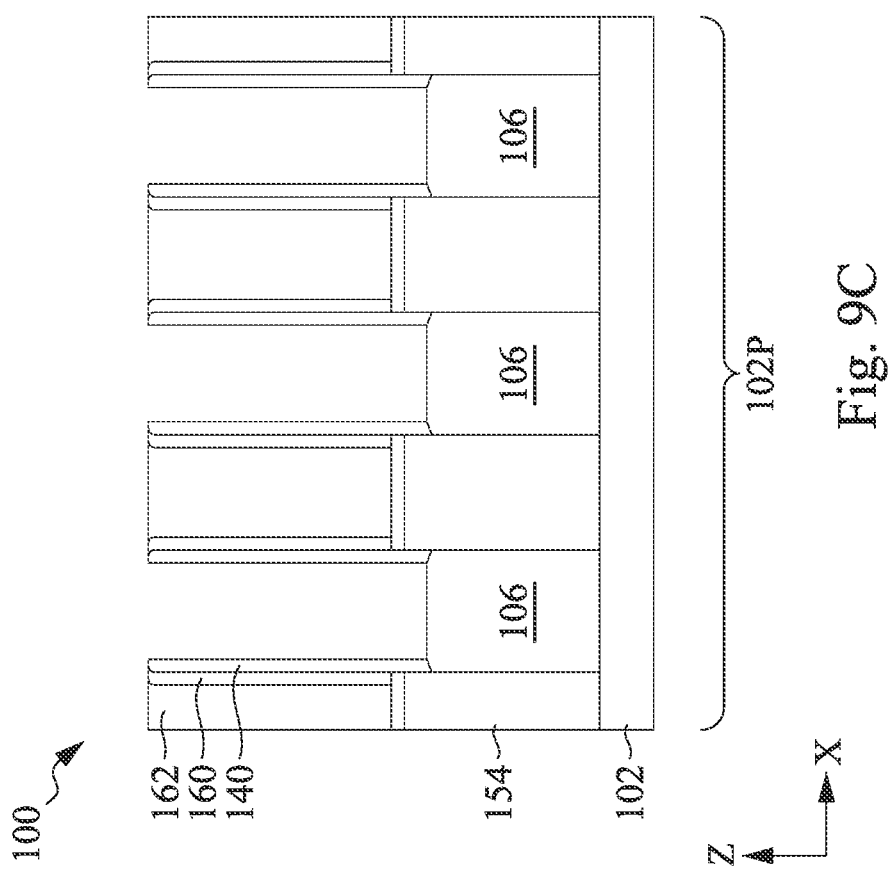

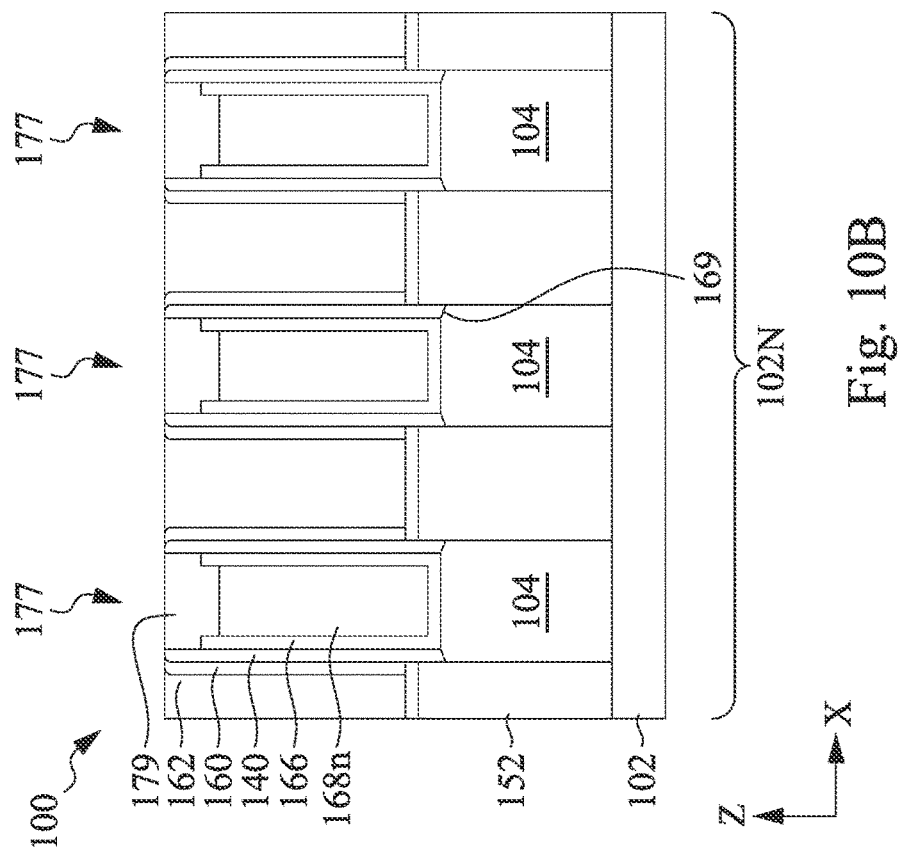
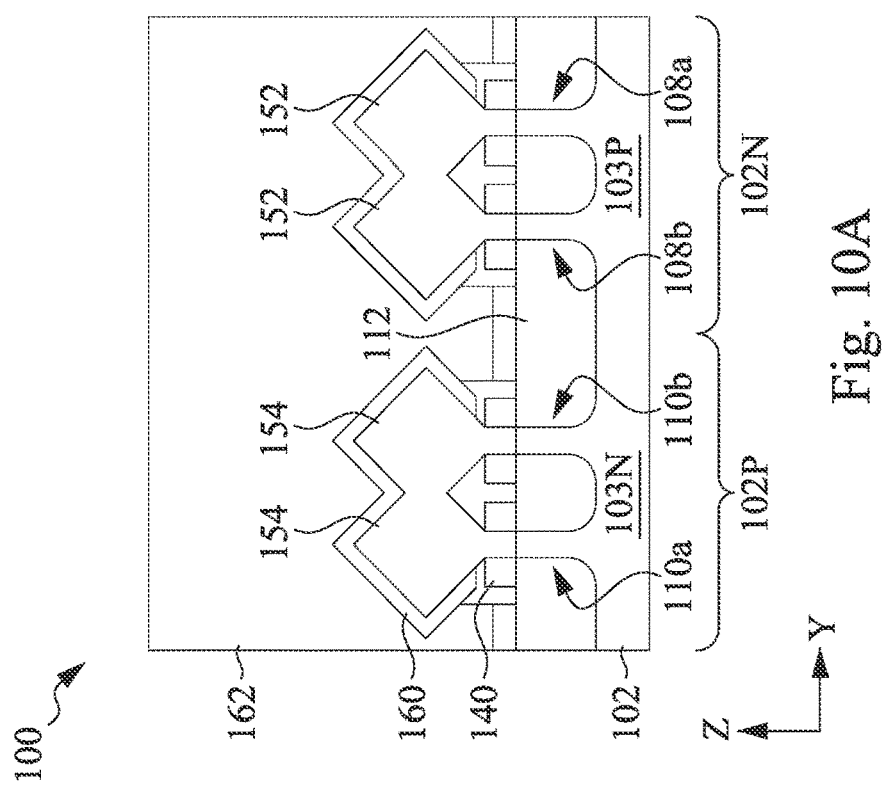
Fig. 10A
Fig. 10B

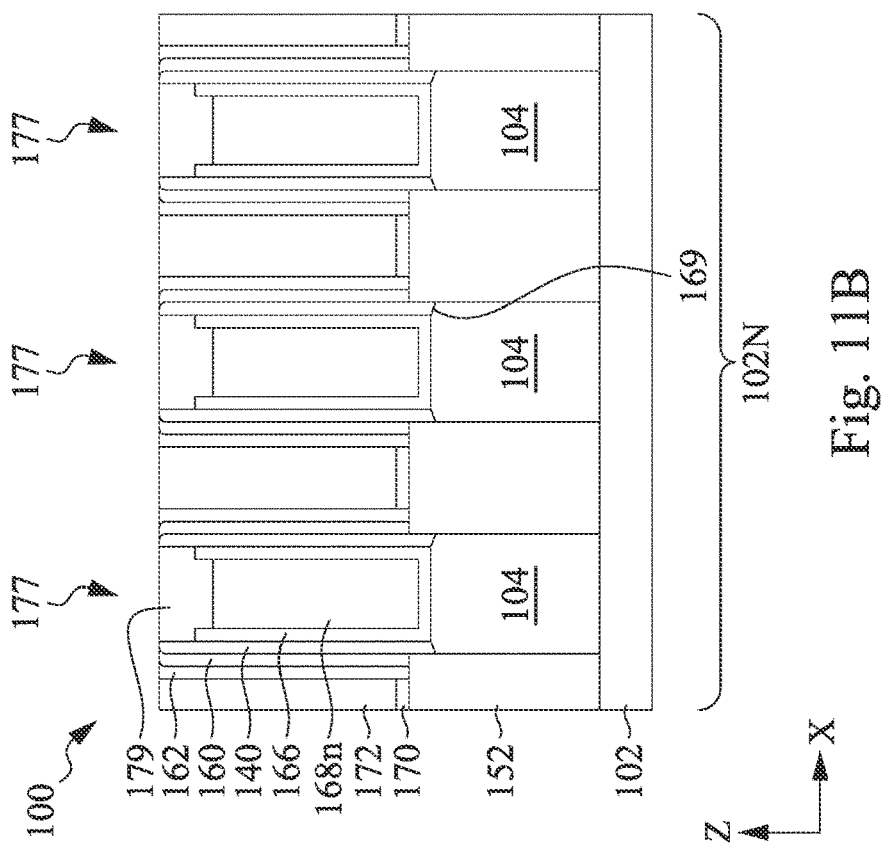
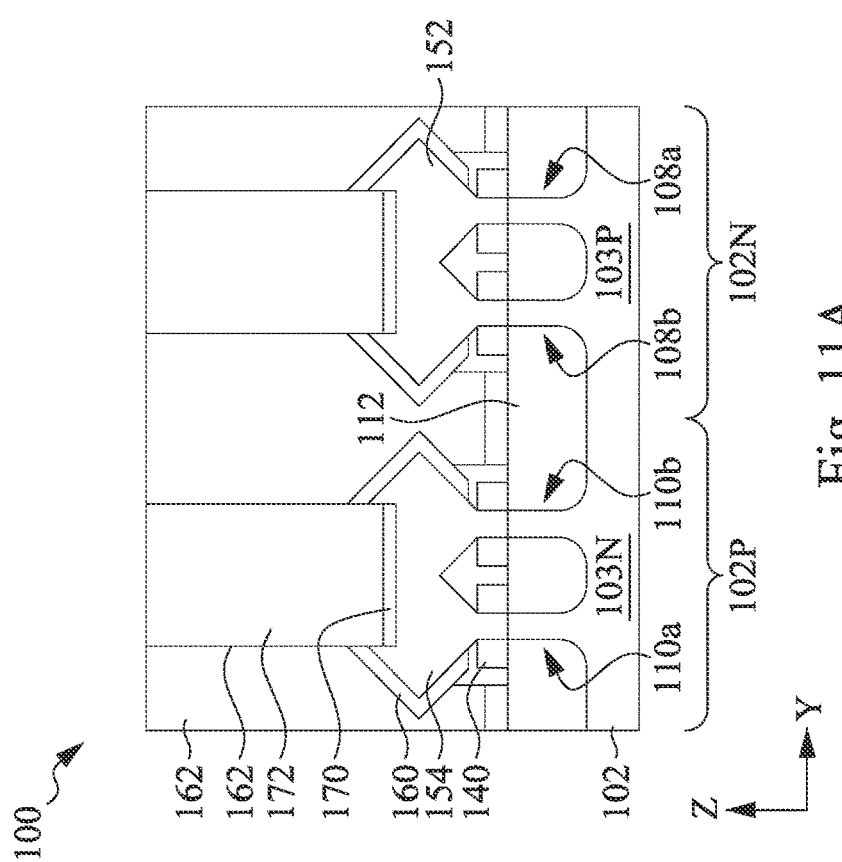
Fig. 11B
Fig. 11A

METHODS OF FORMING SEMICONDUCTOR DEVICE STRUCTURES

CROSS-REFERENCE TO RELATED APPLICATIONS

This application is a continuation application of U.S. patent application Ser. No. 17/406,920 filed Aug. 19, 2021, which is incorporated by reference in its entirety.

BACKGROUND

An integrated chip may contain billions of semiconductor devices. The semiconductor devices are formed in a front-end-of-the-line (FEOL) process and is electrically interconnected by way of back-end-of-the-line (BEOL) metal interconnect layers in an interconnect structure that is formed above the devices on an integrated chip. A typical integrated chip includes plurality of metal interconnect layers including different sized metal wires vertically coupled together with metal contacts (i.e., vias).

The processes of fabrication the FEOL semiconductor devices and BEOL interconnect structures may include deposition of a dielectric layer, etching the dielectric layer to form an opening in the dielectric layer, filling the opening with a conductive material, forming a cap layer on the conductive material, and other operations. At least some of the operations can leave electric charge accumulated on dielectric materials, which may induce under etch and metal line and/or via burn out.

Therefore, an improved method to form the semiconductor device structure is needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A-12A are cross-sectional side views of various stages of manufacturing the semiconductor device structure of FIG. 4 taken along line A-A, in accordance with some embodiments.

FIGS. 5B-12B are cross-sectional side views of various stages of manufacturing the semiconductor device structure of FIG. 4 taken along line B-B, in accordance with some embodiments.

FIGS. 5C-12C are cross-sectional side views of various stages of manufacturing the semiconductor device structure of FIG. 4 taken along line C-C, in accordance with some embodiments.

DETAILED DESCRIPTION

Figure 1:
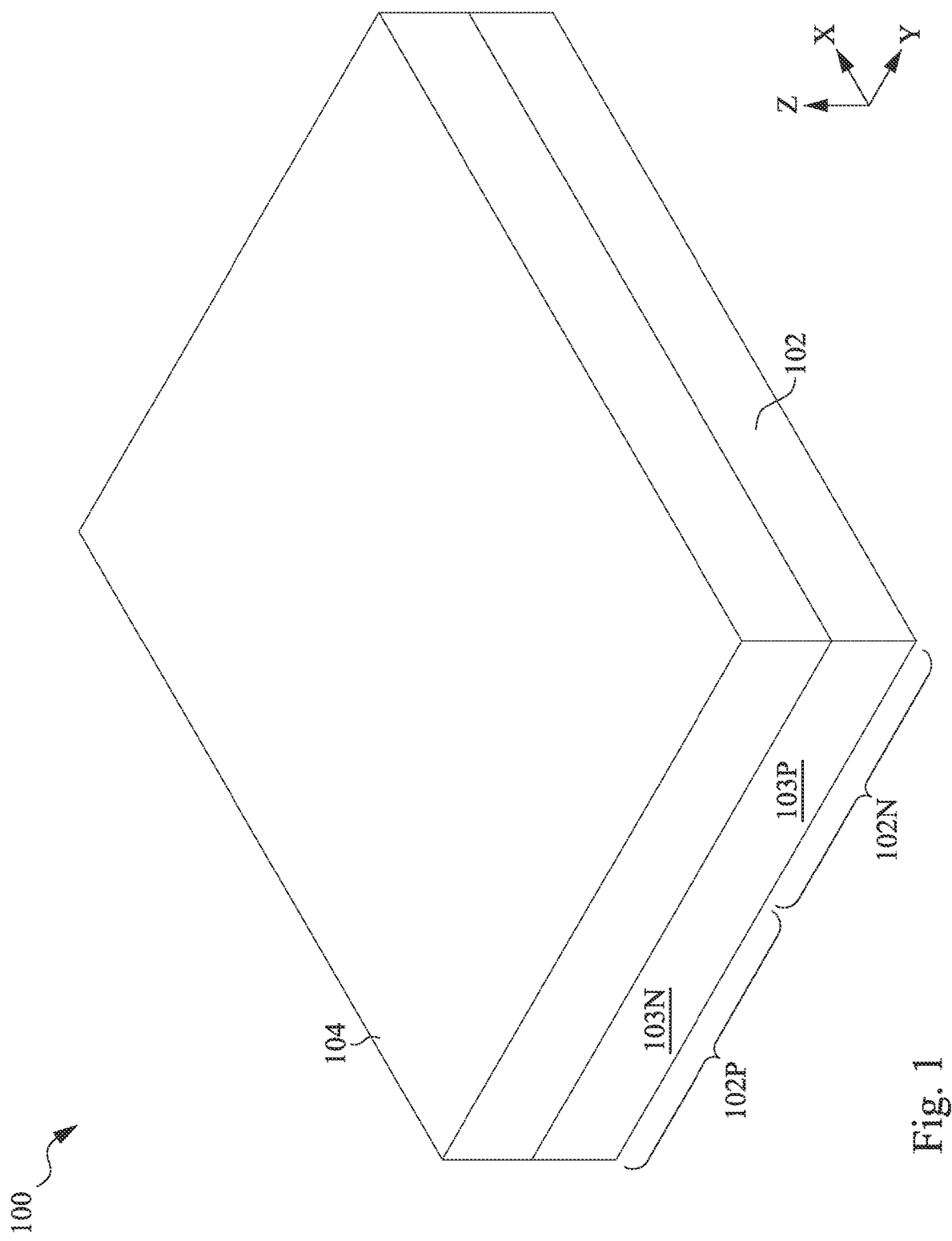
FIGS. 1-4 are perspective views of a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1-12C illustrate various stages of manufacturing a semiconductor device structure 100 in accordance with various embodiments of this disclosure. It is understood that additional operations can be provided before, during, and after processes shown by FIGS. 1-12C and some of the operations described below can be replaced or eliminated, for additional embodiments of the method. The order of the operations/processes may be interchangeable.

FIGS. 1-4 are perspective views of the semiconductor device structure 100, in accordance with some embodiments. In FIG. 1, a first semiconductor layer 104 is formed on a substrate 102. The substrate may be a part of a chip in a wafer. In some embodiments, the substrate 102 is a bulk semiconductor substrate, such as a semiconductor wafer. For example, the substrate 102 is a silicon wafer. The substrate 102 may include silicon or another elementary semiconductor material such as germanium. In some other embodiments, the substrate 102 includes a compound semiconductor. The compound semiconductor may include gallium arsenide, silicon carbide, indium arsenide, indium phosphide, another suitable semiconductor material, or a combination thereof. In some embodiments, the substrate 102 is a semiconductor-on-insulator (SOI) substrate. The SOI substrate may be fabricated using a separation by implantation of oxygen (SIMOX) process, a wafer bonding process, another applicable method, or a combination thereof.

The substrate 102 may be doped with P-type or N-type impurities. As shown in FIG. 1, the substrate 102 has a P-type metal-oxide-semiconductor region 102P (PMOS region 102P) and an N-type metal-oxide-semiconductor region 102N (NMOS region 102N) adjacent to the PMOS region 102P, in accordance with some embodiments. While not shown in scale in some figures, the PMOS region 102P and NMOS region 102N belong to a continuous substrate 102. In some embodiments of the present disclosure, the PMOS region 102P is used to form a PMOS structure thereon, whereas the NMOS region 102N is used to form an NMOS structure thereon. In some embodiments, an N-well region 103N and a P-well region 103P are formed in the substrate 102, as shown in FIG. 1. For example, the N-well region 103N is formed in the substrate 102 in the PMOS region 102P, whereas the P-well region 103P is formed in the substrate 102 in the NMOS region 102N. The P-well region 103P and the N-well region 103N may be formed by any suitable technique, for example, by separate ion implantation processes in some embodiments. By using two different implantation mask layers (not shown), the P-well region 103P and the N-well region 103N can be sequentially formed in different ion implantation processes.

The first semiconductor layer 104 is deposited over the substrate 102, as shown in FIG. 1. The first semiconductor layer 104 may be made of any suitable semiconductor material, such as silicon, germanium, III-V semiconductor material, or combinations thereof.

In some embodiments, the first semiconductor layer 104 is substantially made of silicon. The first semiconductor layer 104 may be formed by an epitaxial growth process, such as metal-organic chemical vapor deposition (MOCVD), metal-organic vapor phase epitaxy (MOVPE), plasma-enhanced chemical vapor deposition (PECVD), remote plasma chemical vapor deposition (RP-CVD), molecular beam epitaxy (MBE), hydride vapor phase epitaxy (HYPE), liquid phase epitaxy (LPE), chloride vapor phase epitaxy (Cl-VPE), or any other suitable process.

Figure 2:
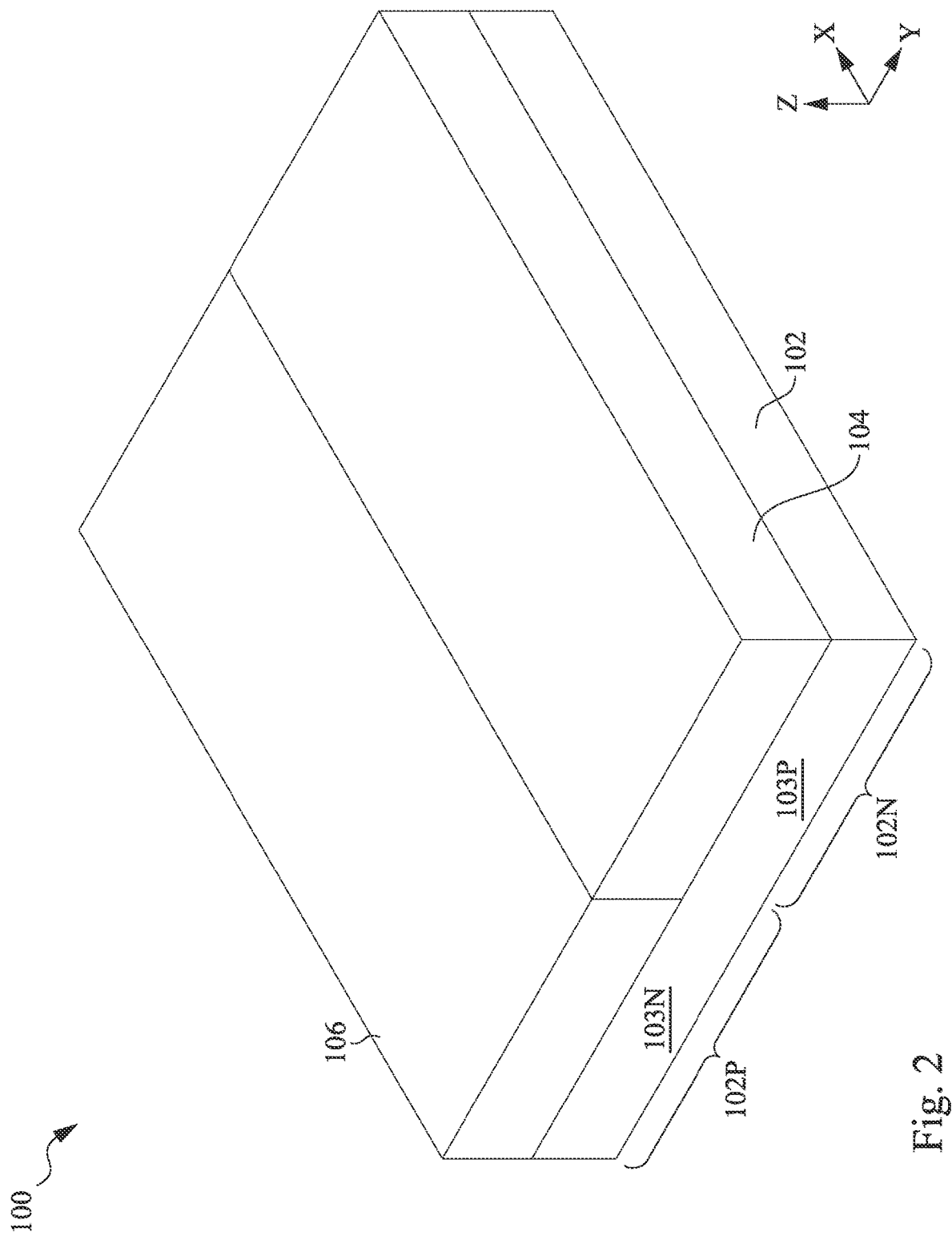

In FIG. 2, the portion of the first semiconductor layer 104 disposed over the N-well region 103N is removed, and a second semiconductor layer 106 is formed over the N-well region 103N and adjacent the portion of the first semiconductor layer 104 disposed over the P-well region 103P. A patterned mask layer (not shown) may be first formed on the portion of the first semiconductor layer 104 disposed over the P-well region 103P, and the portion of the first semiconductor layer 104 disposed over the N-well region 103N may be exposed. A removal process, such as a dry etch, wet etch, or a combination thereof, may be performed to remove the portion of the first semiconductor layer 104 disposed over the N-well region 103N, and the N-well region 103N may be exposed. The removal process does not substantially affect the mask layer (not shown) formed on the portion of the first semiconductor layer 104 disposed over the P-well region 103P, which protects the portion of the first semiconductor layer 104 disposed over the P-well region 103P. Next, the second semiconductor layer 106 is formed on the exposed N-well region 103N. The second semiconductor layer 106 may be made of any suitable semiconductor material, such as silicon, germanium, III-V semiconductor material, or combinations thereof. In some embodiments, the second semiconductor layer 106 is substantially made of silicon germanium. The second semiconductor layer 106 may be formed by the same process as the first semiconductor layer 104. For example, the second semiconductor layer 106 may be formed on the exposed N-well region 103N by an epitaxial growth process, which does not form the second semiconductor layer 106 on the mask layer (not shown) disposed on the first semiconductor layer 104. As a result, the first semiconductor layer 104 is disposed over the P-well region 103P in the NMOS region 102N, and the second semiconductor layer 106 is disposed over the N-well region 103N in the PMOS region 102P.

Portions of the first semiconductor layer 104 may serve as channels in the subsequently formed NMOS structure in the NMOS region 102N. Portions of the second semiconductor layer 106 may serve as channels in the subsequently formed PMOS structure in the PMOS region 102P. In some embodiments, the NMOS structure and the PMOS structure are FinFETs. While embodiments described in this disclosure are described in the context of FinFETs, implementations of some aspects of the present disclosure may be used in other processes and/or in other devices, such as planar FETs, nanosheet channel FETs, Horizontal Gate All Around (HGAA) FETs, Vertical Gate All Around (VGAA) FETs, and other suitable devices.

Figure 3:
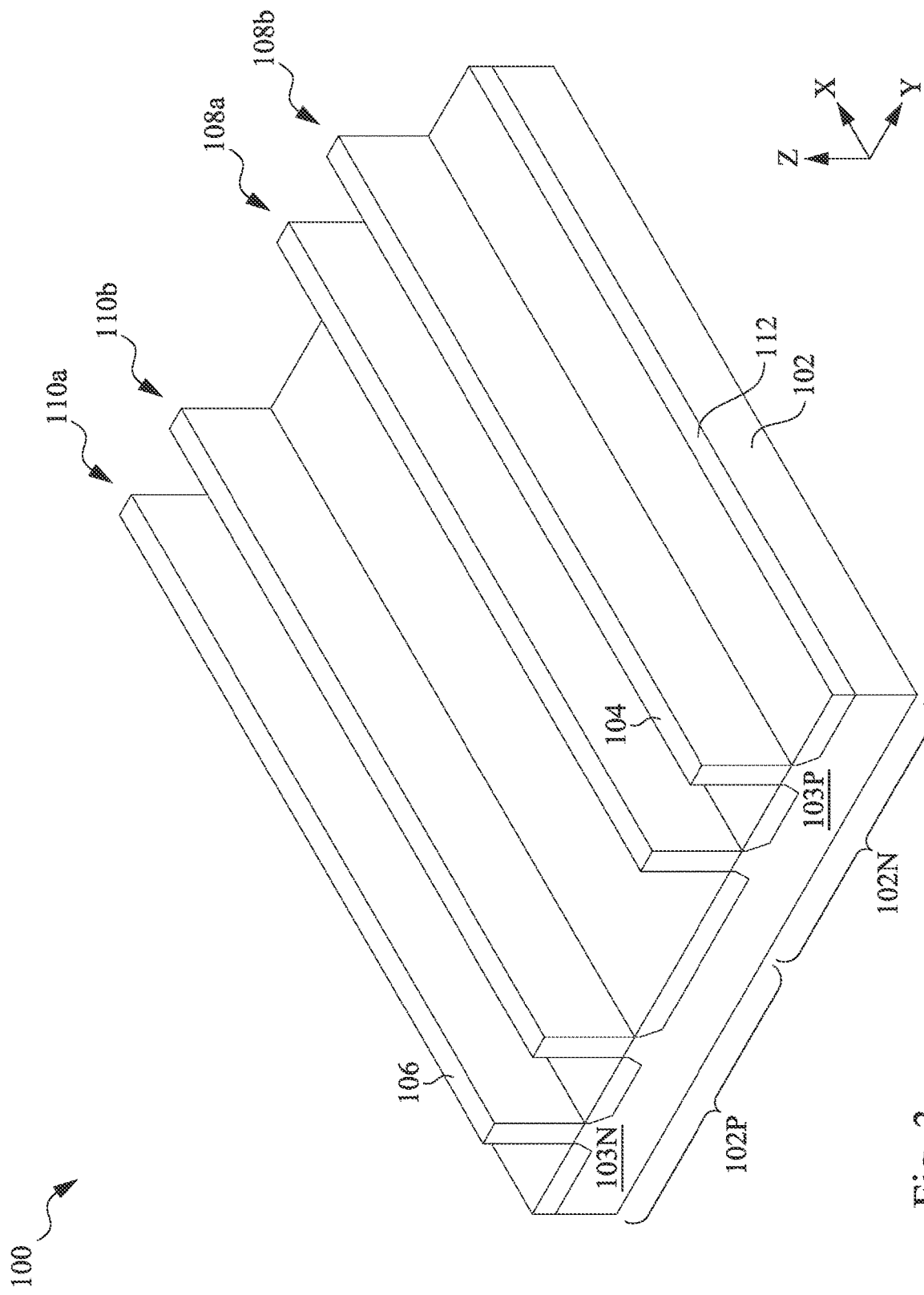

In FIG. 3, a plurality of fins 108a, 108b, 110a, 110b are formed from the first and second semiconductor layers 104, 106, respectively. The fins 108a, 108b, 110a, 110b may be patterned by any suitable method. For example, the fins 108a, 108b, 110a, 110b may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer (not shown) is formed over a substrate and patterned using a photolithography process. Spacers (not shown) are formed alongside the patterned sacrificial layer using a self-aligned process. The sacrificial layer is then removed, and the remaining spacers may then be used to pattern the substrate and form the fins.

The fins 108a, 108b may each include the first semiconductor layer 104, and a portion of the first semiconductor layer 104 may serve as an NMOS channel. Each fin 108a, 108b may also include the P-well region 103P. Likewise, the fins 110a, 110b may each include the second semiconductor layer 106, and a portion of the second semiconductor layer 106 may serve as a PMOS channel. Each fin 110a, 110b may also include the N-well region 103N. A mask (not shown) may be formed on the first and second semiconductor layers 104, 106, and may remain on the fins 108a-b and 110a-b.

Next, an insulating structure 112 is formed between adjacent fins 108a-b, 110a-b. The insulating structure 112 may be first formed between adjacent fins 108a-b, 110a-b and over the fins 108a-b, 110a-b, so the fins 108a-b, 110a-b are embedded in the insulating structure 112. The insulating structure 112 may include an oxygen-containing material, such as silicon oxide, carbon or nitrogen doped oxide, or fluorine-doped silicate glass (FSG); a nitrogen-containing material, such as silicon nitride, silicon oxynitride (SiON), SiOCN, SiCN; a low-K dielectric material (e.g., a material having a K value lower than that of silicon dioxide); or any suitable dielectric material. The insulating structure 112 may be formed by any suitable method, such as low-pressure chemical vapor deposition (LPCVD), plasma enhanced CVD (PECVD) or flowable CVD (FCVD). An annealing process may be performed after forming the insulating structure 112 embedding the fins 108a-b, 110a-b in order to improved physical properties, such as hardness or wet etch rate (WER), of the insulating structure 112. The annealing process may be a thermal annealing process performed at a temperature greater than about 600 degrees Celsius.

Next, a planarization process, such as a chemical-mechanical polishing (CMP) process may be performed to expose the top of the fins 108a-b, 110a-b. In some embodiments, the planarization process exposes the top of the mask (not shown) disposed on the fins 108a-b and 110a-b. The insulating structure 112 is then recessed by removing portions of the insulating structure 112 located on both sides of each fin 108a-b, 110a-b. The recessed insulating structure 112 may be shallow trench isolation (STI) region.

The insulating structure 112 may be recessed by any suitable removal process, such as dry etch or wet etch that selectively removes portions of the insulating structure 112 but does not substantially affect the semiconductor materials of the fins 108a-b, 110a-b. As a result of the dry or wet etch process to recess the portions of the insulating structure 112, electric charge can be accumulated on the insulating structure 112. The electric charge accumulated on the insulating structure 112 can lead to issues such as under etch. Furthermore, if the electric charge accumulated on the insulating structure 112 is not removed, the breakdown voltage of the insulating structure 112 may be reduced, leading to reduced time-dependent dielectric breakdown (TDDB).

In order to remove the electric charge accumulated on the insulating structure 112, an ultraviolet (UV) curing process is performed on the semiconductor device structure 100 after the etch process to recess the insulating structure 112. The UV curing process includes exposing the insulating structure 112 to a UV light having a wavelength ranging from about 200 nm to about 400 nm. The processing temperature of the UV curing process ranges from about 70 degrees Celsius to about 400 degrees Celsius, and the processing pressure ranges from about 1 Torr to about 10 TOM The UV curing time ranges from about 1 s to about 120 s. The UV curing process removes the electric charge accumulated on the insulating structure 112 while not substantially affecting the physical properties of the insulating structure 112 and other materials of the semiconductor device structure 100. In some embodiments, the UV curing process may be performed immediately after the etch process to recess the insulating structure 112. In some embodiments, a clean process is performed to remove residue etchants from the insulating structure 112 after the etch process to recess the insulating structure 112, and the UV curing process is performed immediately after the clean process. In some embodiments, the clean process may use solutions such as HF, high temperature sulfuric peroxide mixture (HTSPM), and ammonia plus hydrogen peroxide. In some embodiments, the UV curing process is performed after the etch process and before any subsequent deposition process.

Figure 4:
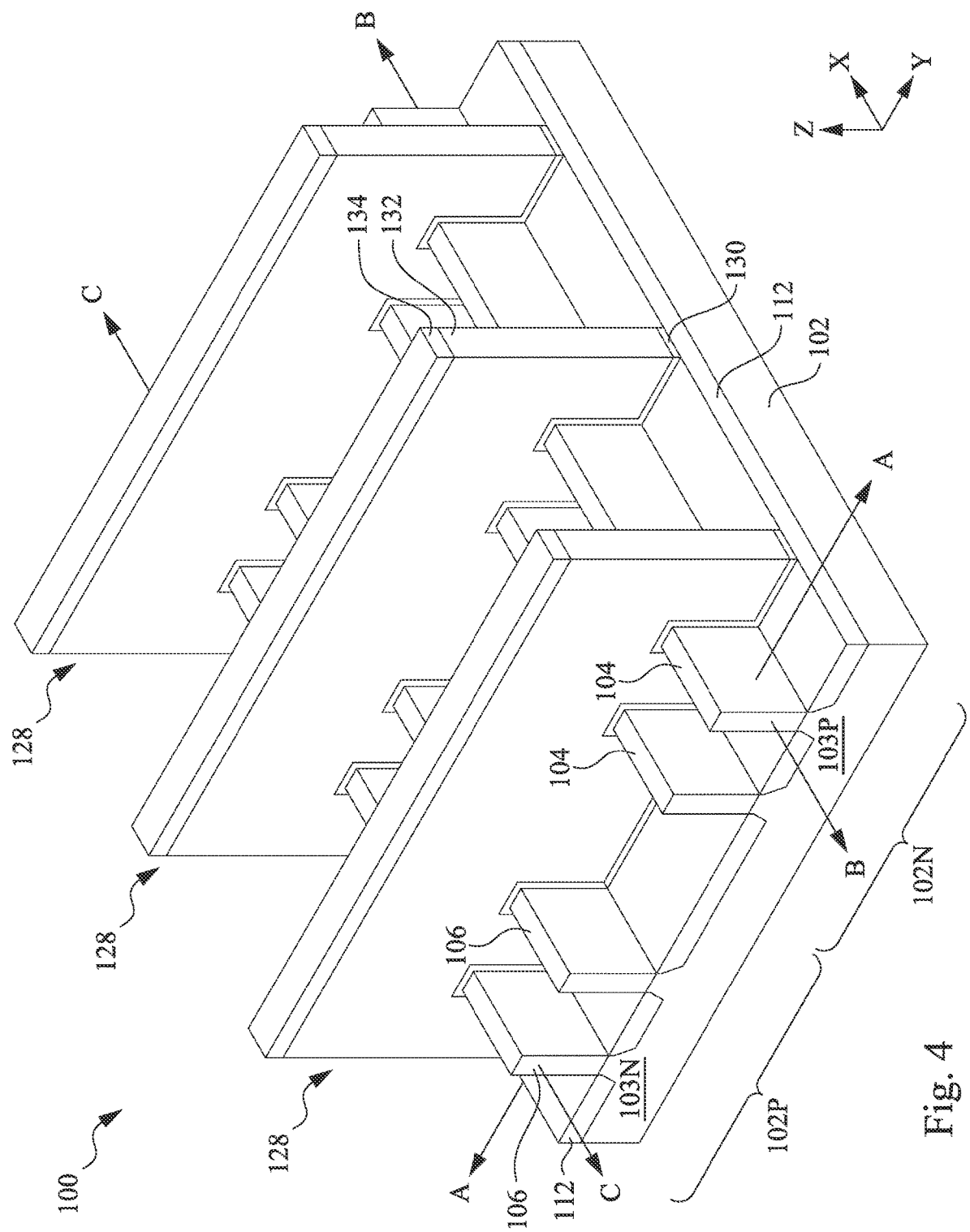

In FIG. 4, one or more sacrificial gate stacks 128 are formed on a portion of the fins 108a-b, 110a-b. Each sacrificial gate stack 128 may include a sacrificial gate dielectric layer 130, a sacrificial gate electrode layer 132, and a mask structure 134. The sacrificial gate dielectric layer 130 may include one or more layers of dielectric material, such as $SiO_2$, SiN, a high-K dielectric material, and/or other suitable dielectric material. In some embodiments, the sacrificial gate dielectric layer 130 may be deposited by a CVD process, a sub-atmospheric CVD (SACVD) process, a FCVD process, an ALD process, a PVD process, or other suitable process. The sacrificial gate electrode layer 132 may include polycrystalline silicon (polysilicon). The mask structure 134 may include an oxygen-containing layer and a nitrogen-containing layer. In some embodiments, the sacrificial gate electrode layer 132 and the mask structure 134 are formed by various processes such as layer deposition, for example, CVD (including both LPCVD and PECVD), PVD, ALD, thermal oxidation, e-beam evaporation, or other suitable deposition techniques, or combinations thereof.

The sacrificial gate stacks 128 may be formed by first depositing blanket layers of the sacrificial gate dielectric layer 130, the sacrificial gate electrode layer 132, and the mask structure 134, followed by pattern and etch processes. For example, the pattern process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etch process may include dry etch (e.g., RIE), wet etch, other etch methods, and/or combinations thereof. By patterning the sacrificial gate stacks 128, the fins 108a-b, 110a-b are partially exposed on opposite sides of the sacrificial gate stacks 128. Portions of the insulating structure 112 are exposed as a result of the etch process(es) to form the sacrificial gate stacks 128. While three sacrificial gate stacks 128 are shown in FIG. 4, it can be appreciated that they are for illustrative purpose only and any number of the sacrificial gate stacks 128 may be formed.

The etch processes to form the sacrificial gate stacks 128 can result in electric charge accumulate on the exposed portions of the insulating structure 112, and the UV curing process may be performed immediately after the formation of the sacrificial gate stacks 128 to remove the electric charge accumulated on the insulating structure 112 while not substantially affecting the physical properties of the insulating structure 112 and other materials of the semiconductor device structure 100. The UV curing process may be the same UV curing process as described in FIG. 3. In some embodiments, a clean process, such as the clean process described in FIG. 3, may be performed immediately after the etch processes to form the sacrificial gate stacks 128, and the UV curing process is performed immediately after the clean process.

FIGS. 5A-12A are cross-sectional side views of various stages of manufacturing the semiconductor device structure 100 of FIG. 4 taken along line A-A, in accordance with some embodiments. FIGS. 5B-12B are cross-sectional side views of various stages of manufacturing the semiconductor device structure 100 of FIG. 4 taken along line B-B, in accordance with some embodiments. FIGS. 5C-12C are cross-sectional side views of various stages of manufacturing the semiconductor device structure 100 of FIG. 4 taken along line C-C, in accordance with some embodiments.

Figure 5B:
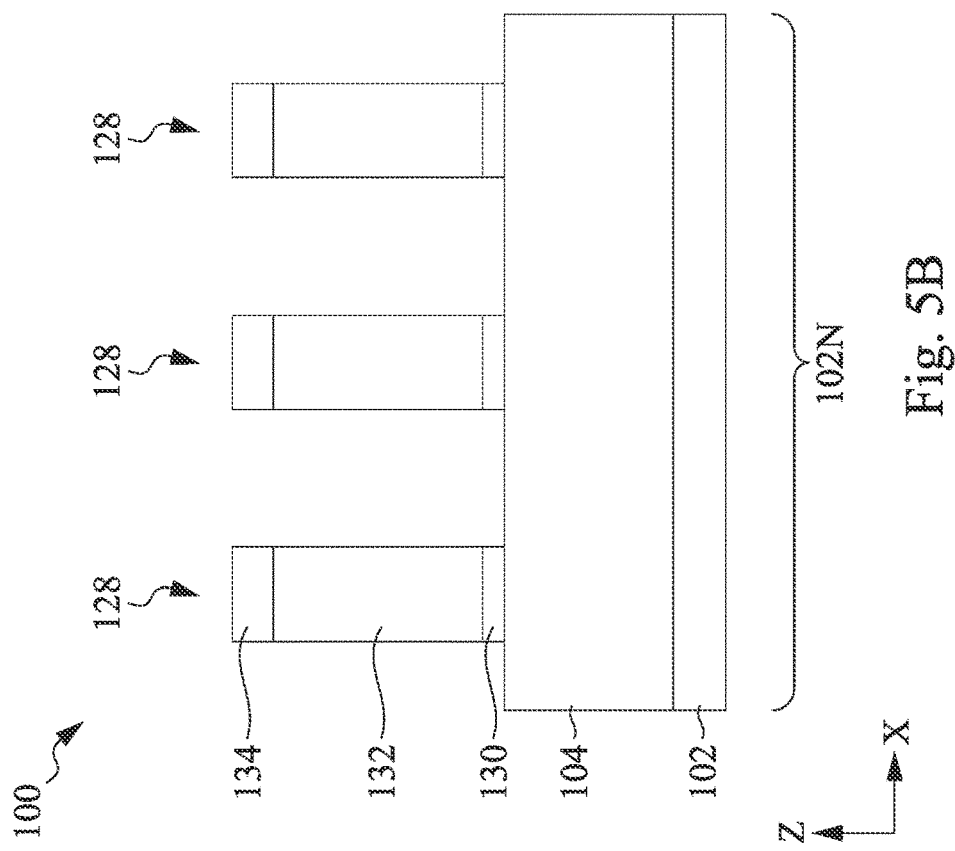
Figure 5A:
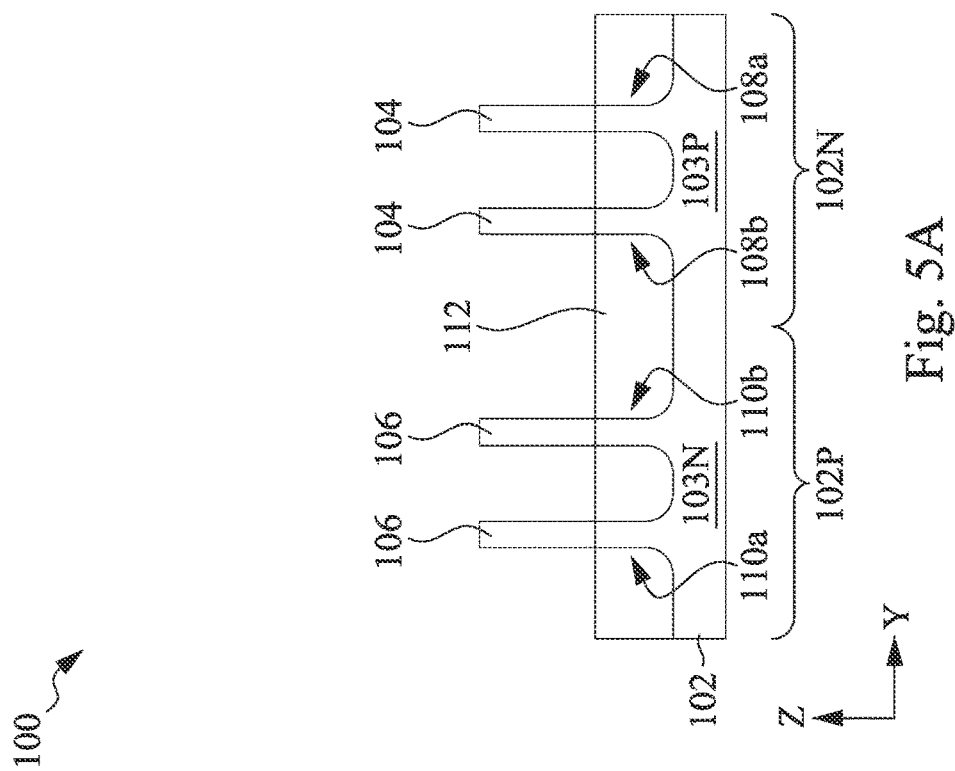
Figure 6C:
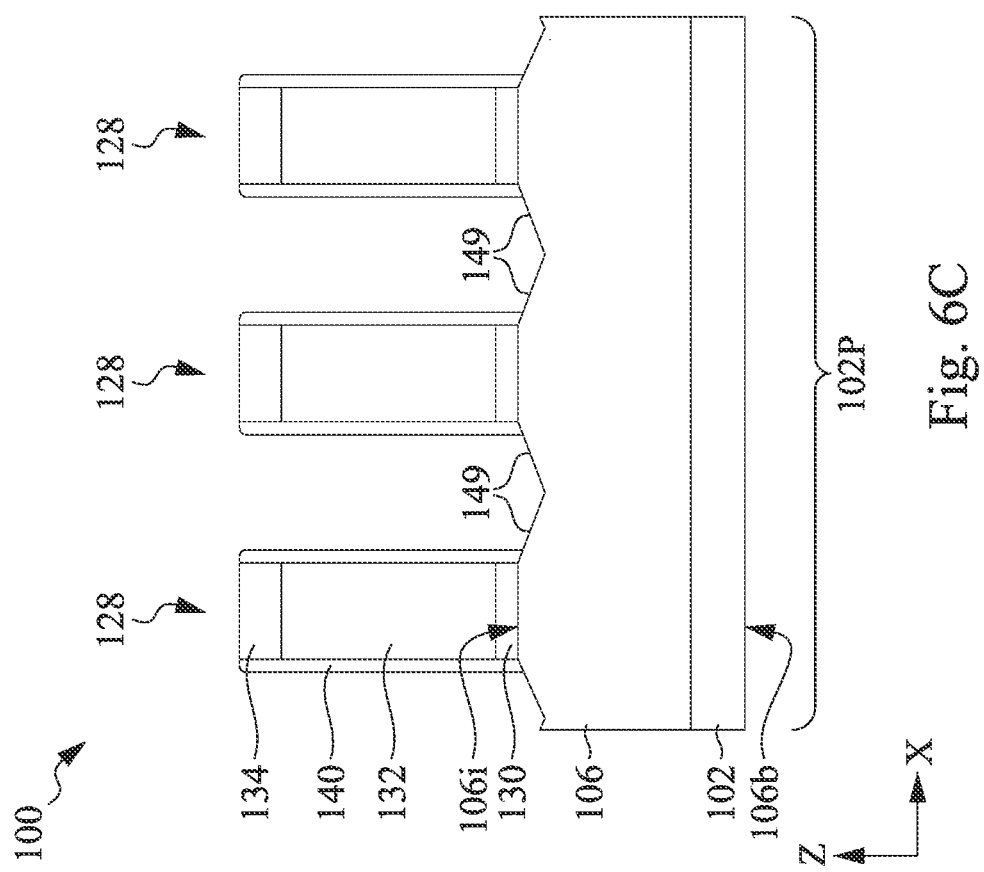

FIGS. 5A-5C illustrate a stage after the sacrificial gate stacks 128 are formed on a portion of the fins 108a-b, 110a-b. In FIGS. 6A-6C, a spacer 140 is formed on the sacrificial gate stacks 128 and the exposed portions of the first and second semiconductor layers 104, 106. The spacer 140 may be conformally deposited on the exposed surfaces of the semiconductor device structure 100. The conformal spacer 140 may be formed by ALD or any suitable processes. An anisotropic etch is then performed on the spacer 140 using, for example, RIE. During the anisotropic etch process, most of the spacer 140 is removed from horizontal surfaces, such as tops of the sacrificial gate stacks 128 and tops of the fins 108a-b, 110a-b, leaving the spacer 140 on the vertical surfaces, such as on opposite sidewalls of the sacrificial gate stacks 128. The spacers 140 may partially remain on opposite sidewalls of the fins 108a-b, 110a-b, as shown in FIG. 6A. In some embodiments, the spacers 140 formed on the source/drain regions of the fins 108a-b, 110a-b are fully removed.

The spacer 140 may be made of a dielectric material such as silicon oxide ($SiO_2$), silicon nitride ($Si_3N_4$), silicon carbide (SiC), silicon oxynitride (SiON), silicon carbon-nitride (SiCN), silicon oxycarbide (SiOC), silicon oxycarbonitride (SiOCN), air gap, and/or any combinations thereof. In some embodiments, the spacer 140 include one or more layers of the dielectric material discussed above.

In various embodiments where the spacer 140 includes multiple layers, the top portion of the fins 108a-b, 110a-b not covered by the sacrificial gate stacks 128 may have a taper profile 149, as shown in FIGS. 6B, 6C. The taper profile 149 may be formed as a result of multiple exposure of the first and second semiconductor layers 104, 106 to etchants used during formation of the spacer 140. The taper profile 149 between adjacent sacrificial gate stacks 128 forms a shallow V-shaped top surface in the first and second semiconductor layers 104, 106, respectively.

The etch processes to form the spacer 140 can result in electric charge accumulate on the exposed portions of the insulating structure 112, and the UV curing process may be performed immediately after the formation of the spacer 140 to remove the electric charge accumulated on the insulating structure 112 while not substantially affecting the physical properties of the insulating structure 112 and other materials of the semiconductor device structure 100. The UV curing process may be the same UV curing process as described in FIG. 3. In some embodiments, a clean process, such as the clean process described in FIG. 3, may be performed immediately after the etch processes to form the spacer 140, and the UV curing process is performed immediately after the clean process.

Figure 7C:
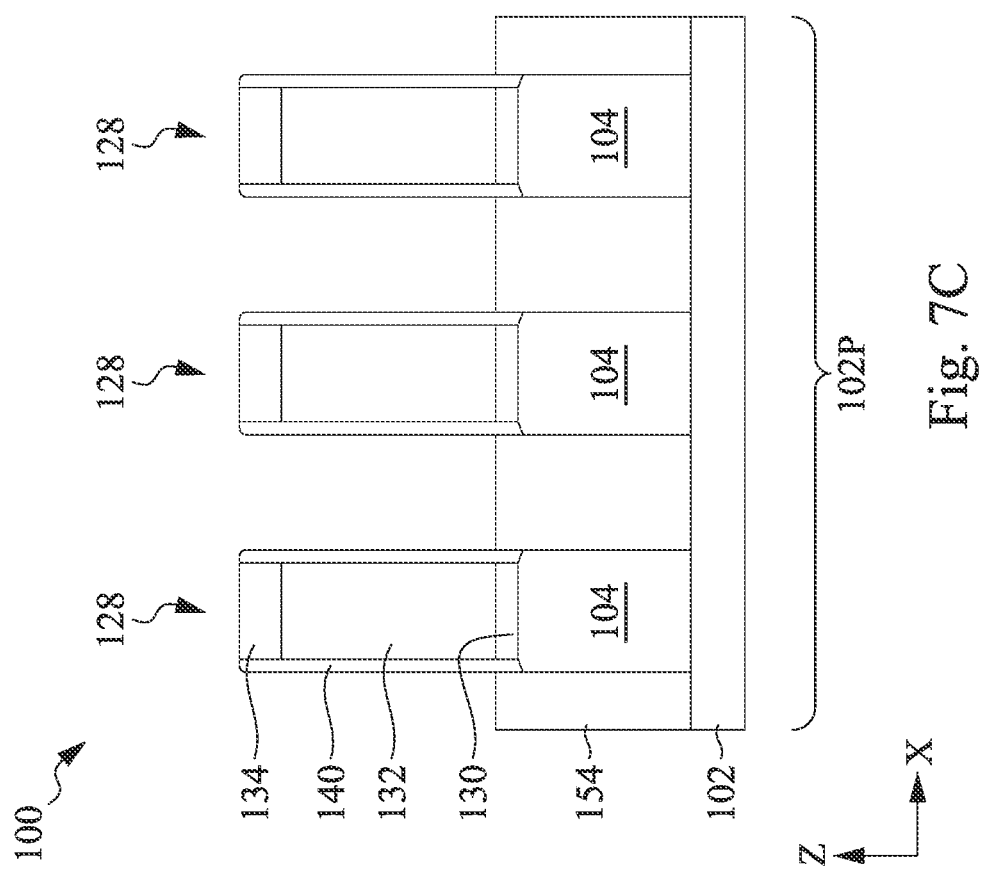

In FIGS. 7A-7C, the first and second semiconductor layers 104, 106 of the fins 108a-b, 110a-b not covered by the sacrificial gate stacks 128 and the spacers 140 are recessed, and source/drain (S/D) epitaxial features 152, 154 are formed. The etchant for recessing of the first and second semiconductor layers 104, 106 is selected so different materials have different etch rates. For example, the first semiconductor layer 104 of the fins 108a-b may have a first etch rate by the etchant, and the second semiconductor layer 106 of the fins 110a-b may have a second etch rate by the etchant. In the embodiments where the first semiconductor layer 104 in the NMOS region 102N and the second semiconductor layer 106 in the PMOS region 102P each includes different materials (e.g., first semiconductor layer 104 in the NMOS region 102N is SiGe and second semiconductor layer 106 in the PMOS region 102P is Si), the first etch rate is faster than the second etch rate. A portion of the P-well region 103P of the fins 108a-b can be slightly etched before the second semiconductor layer 106 in the PMOS region 102P is fully etched away. As a result, a top surface 109 of the fins 108a-b at the NMOS region 102N is at a level below (e.g., about 2 nm to about 10 nm below) a top surface 111 of the fins 110a-b at the PMOS region 102P, resulting in a deeper S/D junction depth in the NMOS region 102N than that of the PMOS region 102P. While not shown, it is contemplated that such a difference between the top surface 109 and the top surface 111 is applicable to various embodiments of this disclosure.

The etch processes to recess the first and second semiconductor layers 104, 106 can result in electric charge accumulate on the exposed portions of the insulating structure 112, and the UV curing process may be performed immediately after the etch processes to remove the electric charge accumulated on the insulating structure 112 while not substantially affecting the physical properties of the insulating structure 112 and other materials of the semiconductor device structure 100. The UV curing process may be the same UV curing process as described in FIG. 3. In some embodiments, a clean process, such as the clean process described in FIG. 3, may be performed immediately after the etch processes, and the UV curing process is performed immediately after the clean process. The S/D epitaxial features 152, 154 are formed after the UV curing process.

For devices in the NMOS region 102N, each S/D epitaxial features 152 may include one or more layers of Si, SiP, SiC, SiCP, SiAs, or a group III-V material (InP, GaAs, AlAs, InAs, InAlAs, InGaAs). In some embodiments, each S/D epitaxial feature 152 includes two or more layers of Si, SiP, SiC, SiCP or the group III-V material, and each layer may have a different silicon concentration. Each S/D epitaxial feature 152 may include N-type dopants, such as phosphorus (P), arsenic (As), or other suitable N-type dopants. The S/D epitaxial features 152 may be formed by any suitable method, such as CVD, CVD epitaxy, MBE, or other suitable method. The S/D epitaxial features 152 may be formed on the exposed surface of the fins 108a-b on both sides of each sacrificial gate stack 128, as shown in FIG. 7B. In some embodiments, the portions of the first semiconductor layer 104 on both sides of each sacrificial gate stack 128 are completely removed, and the S/D epitaxial features 152 are formed on the P-well region 103P of the fins 108a-b. The S/D epitaxial features 152 may grow both vertically and horizontally to form facets, which may correspond to crystalline planes of the material used for the substrate 102. In some embodiments, the S/D epitaxial features 152 formed on the P-well region 103P of the fins 108a and 108b are merged, as shown in FIG. 7A. The S/D epitaxial features 152 may each have a top surface at a level higher than a top surface of the first semiconductor layer 104, as shown in FIG. 7B.

For devices in the PMOS region 102P, each S/D epitaxial features 154 may include one or more layers of Si, SiGe, SiGeB, Ge, or a group III-V material (InSb, GaSb, InGaSb), and each layer may have a different silicon or germanium concentration. Each S/D epitaxial feature 154 may include P-type dopants, such as boron (B) or other suitable P-type dopants. In some embodiments, the S/D epitaxial features 152 in the NMOS region 102N and the S/D epitaxial features 154 in the PMOS region 102P are both Si. In some embodiments, the S/D epitaxial features 152 in the NMOS region 102N are Si and the S/D epitaxial features 154 in the PMOS region 102P are SiGe. The S/D epitaxial features 154 may be formed by any suitable method, such as CVD, CVD epitaxy, MBE, or other suitable method. In some embodiments, the portions of the second semiconductor layer 106 on both sides of each sacrificial gate stack 128 are completely removed, and the S/D epitaxial features 154 are formed on the N-well region 103N of the fins 110a-b. The S/D epitaxial features 154 may grow both vertically and horizontally to form facets, which may correspond to crystalline planes of the material used for the substrate 102. In some embodiments, the S/D epitaxial features 154 formed on the N-well region 103N of the fins 110a and 110b are merged, as shown in FIG. 7A. The S/D epitaxial features 154 may each have a top surface at a level higher than a top surface of the second semiconductor layer 106, as shown in FIG. 7C.

Figure 8B:
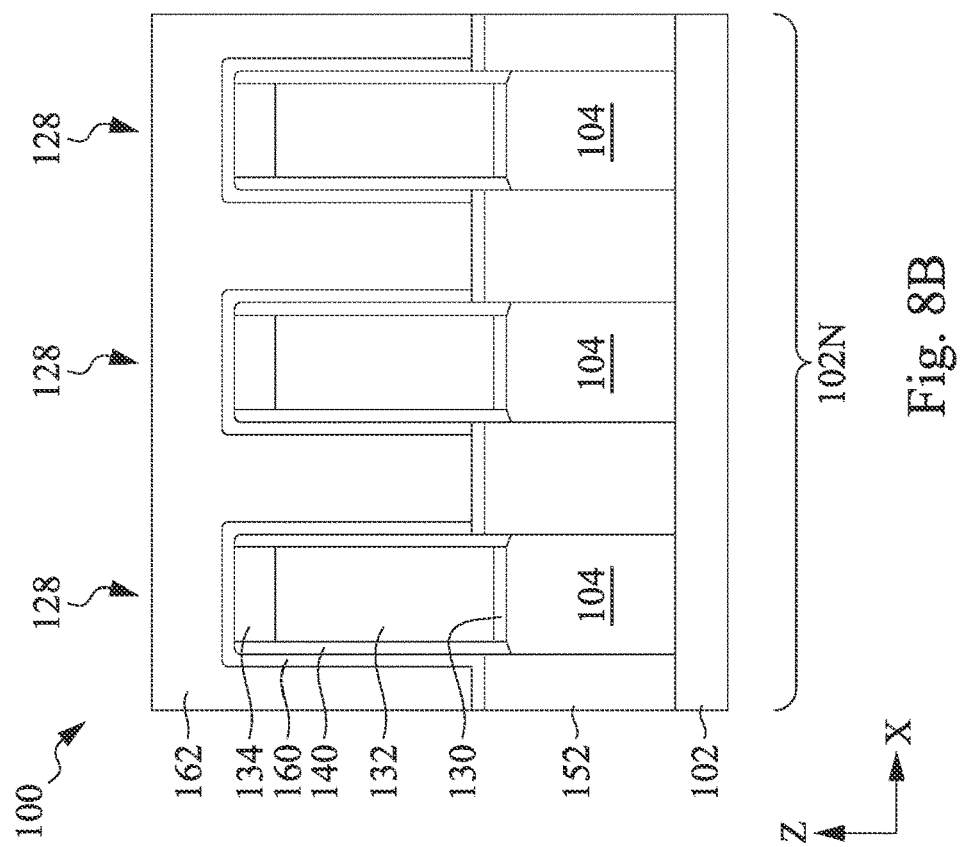
Figure 8A:
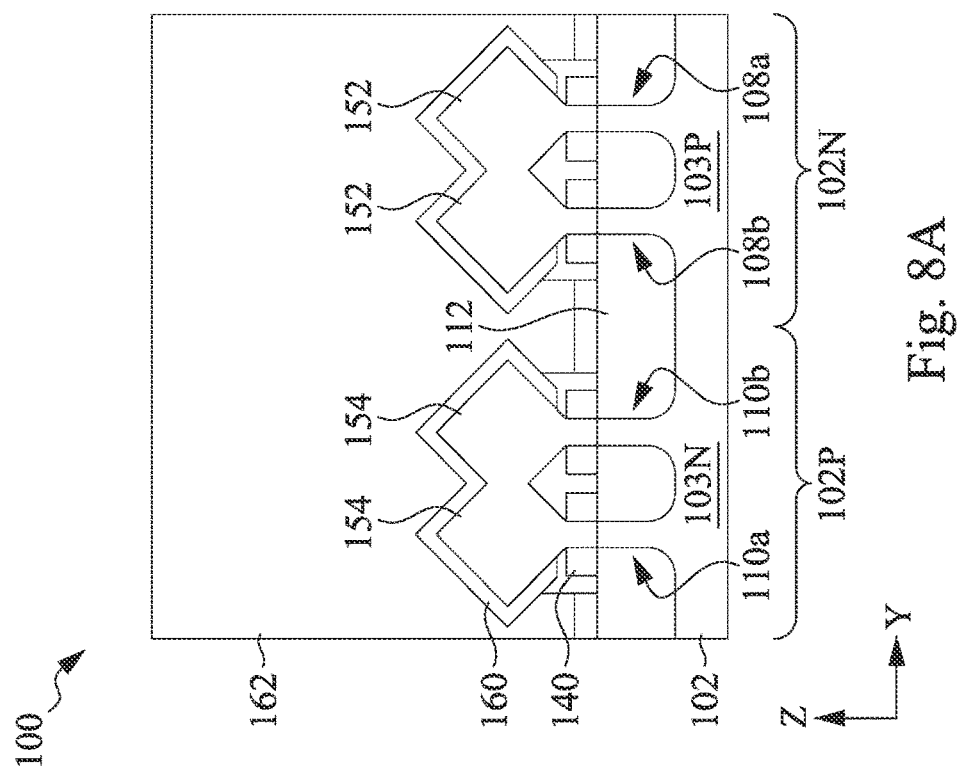
Figure 8C:
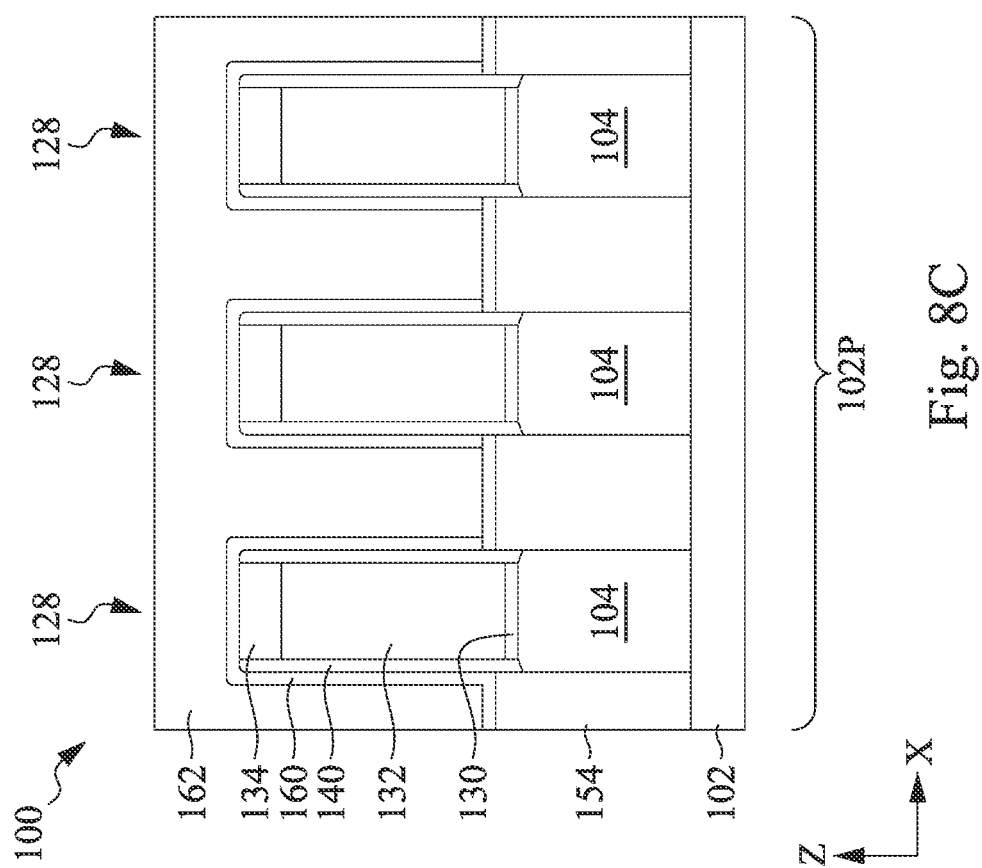

In FIGS. 8A-8C, a contact etch stop layer (CESL) 160 is conformally formed on the exposed surfaces of the semiconductor device structure 100. The CESL 160 covers the sidewalls of the sacrificial gate stacks 128, the insulating structure 112, and the S/D epitaxial features 152, 154. The CESL 160 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be formed by CVD, PECVD, ALD, or any suitable deposition technique. In some embodiments, the CESL 160 is formed by a plasma process, such as PECVD, and electric charge may accumulate on the CESL 160 as a result of the plasma process. In order to remove the accumulated electric charge from the CESL 160, the UV curing process is performed. The UV curing process may be the same UV curing process as described in FIG. 3. The UV curing process may be performed immediately after the plasma process, such as PECVD, to remove the electric charge accumulated on the CESL 160 while not substantially affecting the physical properties of the CESL 160 and other materials of the semiconductor device structure 100.

Next, a first interlayer dielectric (ILD) layer 162 is formed on the CESL 160. The materials for the ILD layer 162 may include compounds comprising Si, O, C, and/or H, such as SiOCH, oxide formed using tetraethylorthosilicate (TEOS), un-doped silicate glass, silicon oxide, or doped silicon oxide such as borophosphosilicate glass (BPSG), fused silica glass (FSG), phosphosilicate glass (PSG), boron doped silicon glass (BSG), and/or other suitable dielectric materials. The first ILD layer 162 may be deposited by a PECVD process or other suitable deposition technique. Similarly, because the first ILD layer 162 may be deposited by a plasma process, electric charge may accumulate on the first ILD layer 162 as a result of the plasma process. In order to remove the accumulated electric charge from the first ILD layer 162, the UV curing process is performed. The UV curing process may be the same UV curing process as described in FIG. 3. The UV curing process may be performed immediately after the plasma process, such as PECVD, to remove the electric charge accumulated on the first ILD layer 162 while not substantially affecting the physical properties of the first ILD layer 162 and other materials of the semiconductor device structure 100.

After the formation of the first ILD layer 162 and the UV curing process, a planarization process is performed to expose the sacrificial gate electrode layer 132. The planarization process may be any suitable process, such as a CMP process. The planarization process removes portions of the first ILD layer 162 and the CESL 160 disposed on the sacrificial gate stacks 128. The planarization process may also remove the mask structure 134.

Figure 9B:
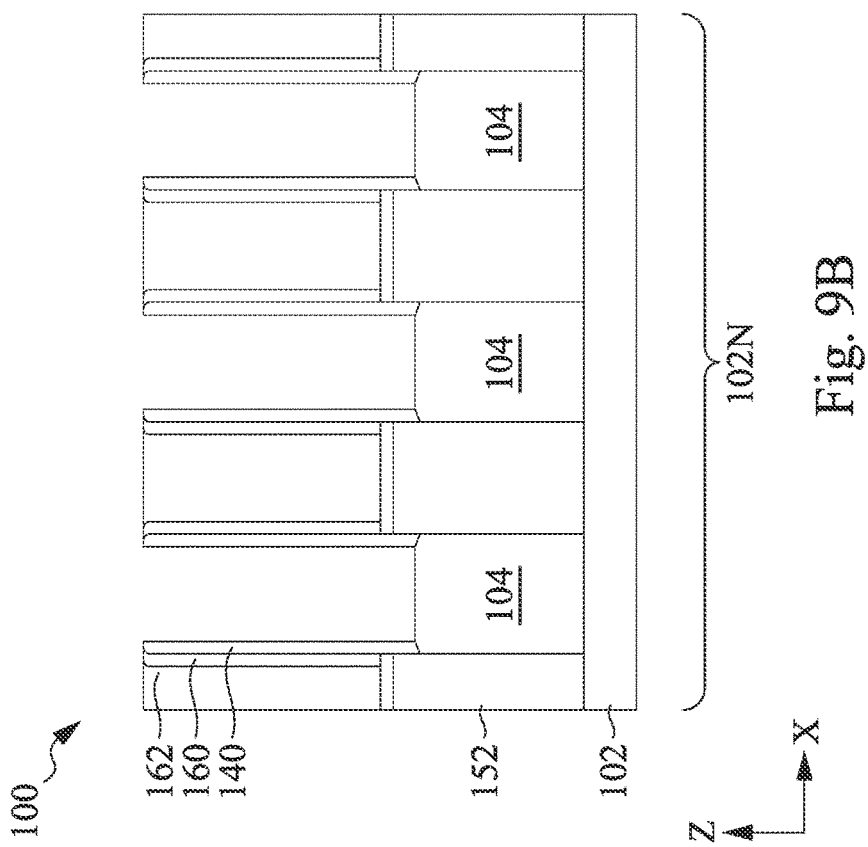
Figure 9A:
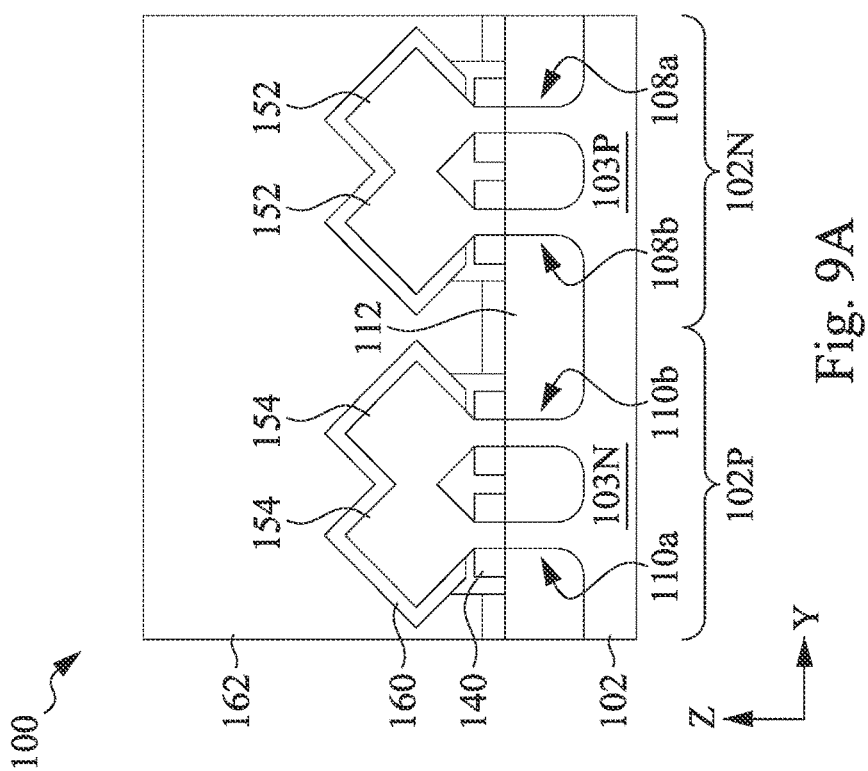

In FIGS. 9A-9C, the mask structure 134 (if not removed during CMP process), the sacrificial gate electrode layers 132 (FIG. 8B), and the sacrificial gate dielectric layers 130 (FIG. 8B) are removed. The sacrificial gate electrode layers 132 and the sacrificial gate dielectric layers 130 may be removed by one or more etch processes, such as dry etch process, wet etch process, or a combination thereof. The one or more etch processes selectively remove the sacrificial gate electrode layers 132 and the sacrificial gate dielectric layers 130 without substantially affects the spacer 140, the CESL 160, and the first ILD layer 162. Electric charge may be accumulated on the CESL 160 and the first ILD layer 162 as a result of the one or more etch processes. In order to remove the accumulated electric charge from the CESL 160 and the first ILD layer 162, the UV curing process is performed. The UV curing process may be the same UV curing process as described in FIG. 3. The UV curing process may be performed immediately after the one or more etch processes to remove the electric charge accumulated on the CESL 160 and the first ILD layer 162 while not substantially affecting the physical properties of the CESL 160, the first ILD layer 162 and other materials of the semiconductor device structure 100. The removal of the sacrificial gate electrode layers 132 and the sacrificial gate dielectric layers 130 exposes a top portion of the first and second semiconductor layers 104, 106 in the channel region.

Figure 10C:
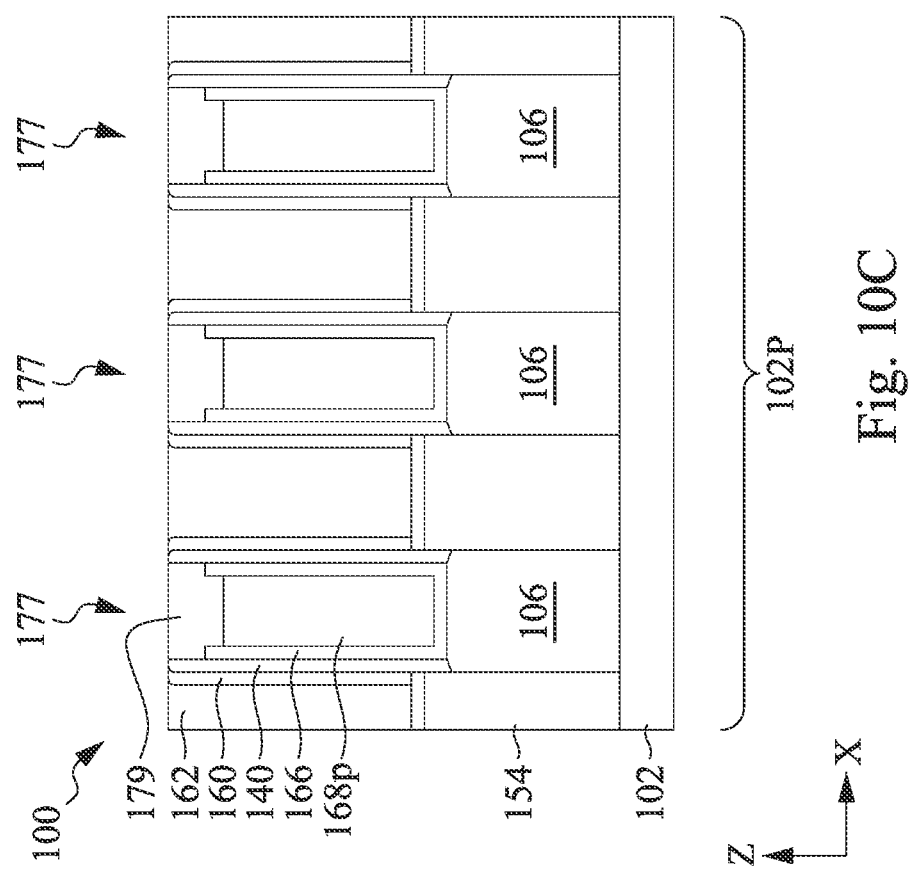

In FIGS. 10A-10C, replacement gate structures 177 are formed. The replacement gate structure 177 may include a gate dielectric layer 166 and a gate electrode layer 168$p$, 168$n$ formed on the gate dielectric layer 166. As can be seen in FIGS. 10B and 10C, the gate dielectric layer 166 is formed on the first and second semiconductor layers 104, 106. The gate dielectric layer 166 may include one or more dielectric layers and may include the same material(s) as the sacrificial gate dielectric layer 130. In some embodiments, the gate dielectric layers 166 may be deposited by one or more ALD processes or other suitable processes. The gate electrode layer 168$p$, 186$n$ may include one or more layers of electrically conductive material, such as polysilicon, aluminum, copper, titanium, tantalum, tungsten, cobalt, molybdenum, tantalum nitride, nickel silicide, cobalt silicide, TiN, WN, AlTi, AlTiO, AlTiC, AlTiN, TaCN, TaC, TaSiN, metal alloys, other suitable materials, and/or combinations thereof. For devices in the NMOS region 102N, the gate electrode layer 168$n$ may be AlTiO, AlTiC, or a combination thereof. For devices in the PMOS region 102P, the gate electrode layer 168$p$ may be AlTiO, AlTiC, AlTiN, or a combination thereof. The gate electrode layers 168 may be formed by PVD, CVD, ALD, electro-plating, or other suitable method.

Optionally, a metal gate etching back (MGEB) process is performed to remove portions of the gate dielectric layer 166 and the gate electrode layer 168$p$, 168$n$. The MGEB process may be a plasma etching process employing one or more etchants such as chlorine-containing gas, a bromine-containing gas, and/or a fluorine-containing gas. After the MGEB process, a top surface of the gate electrode layer 168$p$, 168$n$ may be lower than a top surface of the gate dielectric layer 166. In some embodiments, portions of the spacers 140 are etched back so that the top surface of the spacers 140 is higher than the top surfaces of the gate dielectric layer 166 and the gate electrode layer 168$p$, 168$n$. Electric charge may be accumulated on the CESL 160 and the first ILD layer 162 as a result of the plasma etching of the MGEB process. In order to remove the accumulated electric charge from the CESL 160 and the first ILD layer 162, the UV curing process is performed. The UV curing process may be the same UV curing process as described in FIG. 3. The UV curing process may be performed immediately after the plasma etching of the MGEB process to remove the electric charge accumulated on the CESL 160 and the first ILD layer 162 while not substantially affecting the physical properties of the CESL 160, the first ILD layer 162 and other materials of the semiconductor device structure 100.

Then, trenches formed above the gate dielectric layer 166 and the gate electrode layer 168$p$, 168$n$ as a result of the MGEB processes are filled with a self-aligned contact (SAC) layer 179. The SAC layer 179 can be formed of any dielectric material that has different etch selectivity than the CESL 160 and serves as an etch stop layer during subsequent trench and via patterning for metal contacts. A CMP process is then performed to remove excess deposition of the SAC layer 179 until the top surface of the first ILD layer 162 is exposed.

Figure 11C:
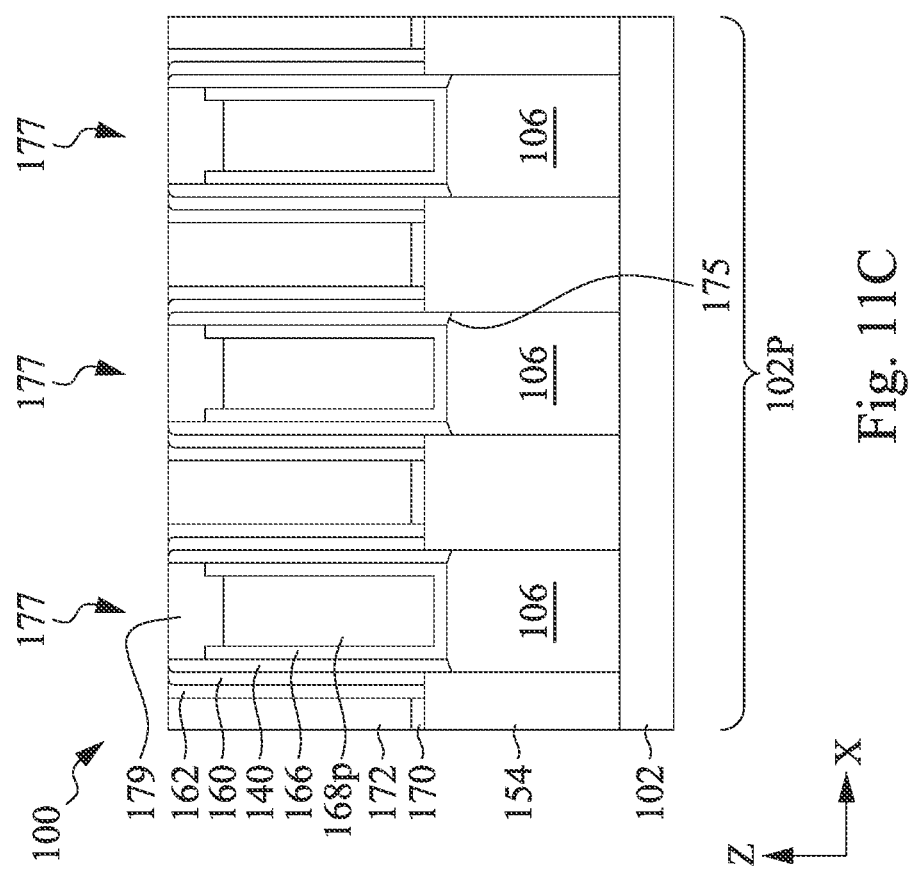

In FIGS. 11A-11C, portions of the first ILD layer 162 and the CESL 160 disposed on both sides of the replacement gate structures 177 are removed. The removal of the portions of the first ILD layer 162 and the CESL 160 forms a contact opening exposing the S/D epitaxial features 152, 154, respectively. In some embodiments, the upper portion of the exposed S/D epitaxial features 152, 154 is removed. The removal of the portions of the first ILD layer 162 and the CESL 160 may be performed by a dry or wet etch process. Electric charge may be accumulated on remaining portions of the CESL 160 and the first ILD layer 162 as a result of the dry or wet etch process. In order to remove the accumulated electric charge from the CESL 160 and the first ILD layer 162, the UV curing process is performed. The UV curing process may be the same UV curing process as described in FIG. 3. The UV curing process may be performed immediately after the dry or wet etch process to remove the electric charge accumulated on the remaining portions of the CESL 160 and the first ILD layer 162 while not substantially affecting the physical properties of the CESL 160, the first ILD layer 162 and other materials of the semiconductor device structure 100.

Next, after the formation of the contact opening and the UV curing process, a conductive feature 172 (i.e., S/D contacts) is then formed in the contact openings over the S/D epitaxial features 152, 154. The conductive feature 172 may include an electrically conductive material, such as one or more of Ru, Mo, Co, Ni, W, Ti, Ta, Cu, Al, TiN and TaN. The conductive feature 172 may be formed by any suitable process, such as PVD, CVD, ALD, electro-plating, or other suitable method. A silicide layer 170 may be formed between each S/D epitaxial feature 152, 154 and the conductive feature 172, as shown in FIGS. 11A-11C. The silicide layer 170 conductively couples the S/D epitaxial features 152, 154 to the conductive feature 172. The silicide layer 170 is a metal or metal alloy silicide, and the metal includes a noble metal, a refractory metal, a rare earth metal, alloys thereof, or combinations thereof. Once the conductive features 172 are formed, a planarization process, such as CMP, is performed on the semiconductor device structure 100 until the top surface of the SAC layer 179 (if used) is exposed.

Figure 12A:
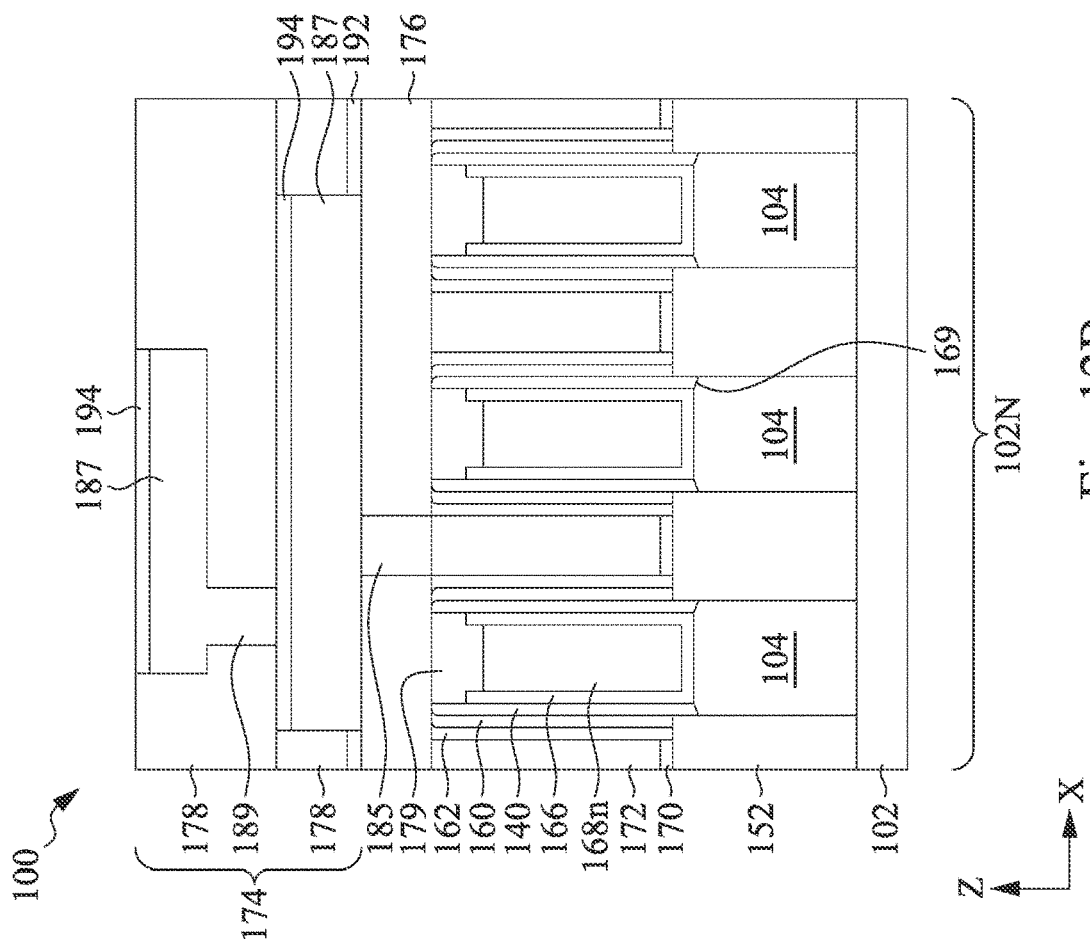
Figure 12B:
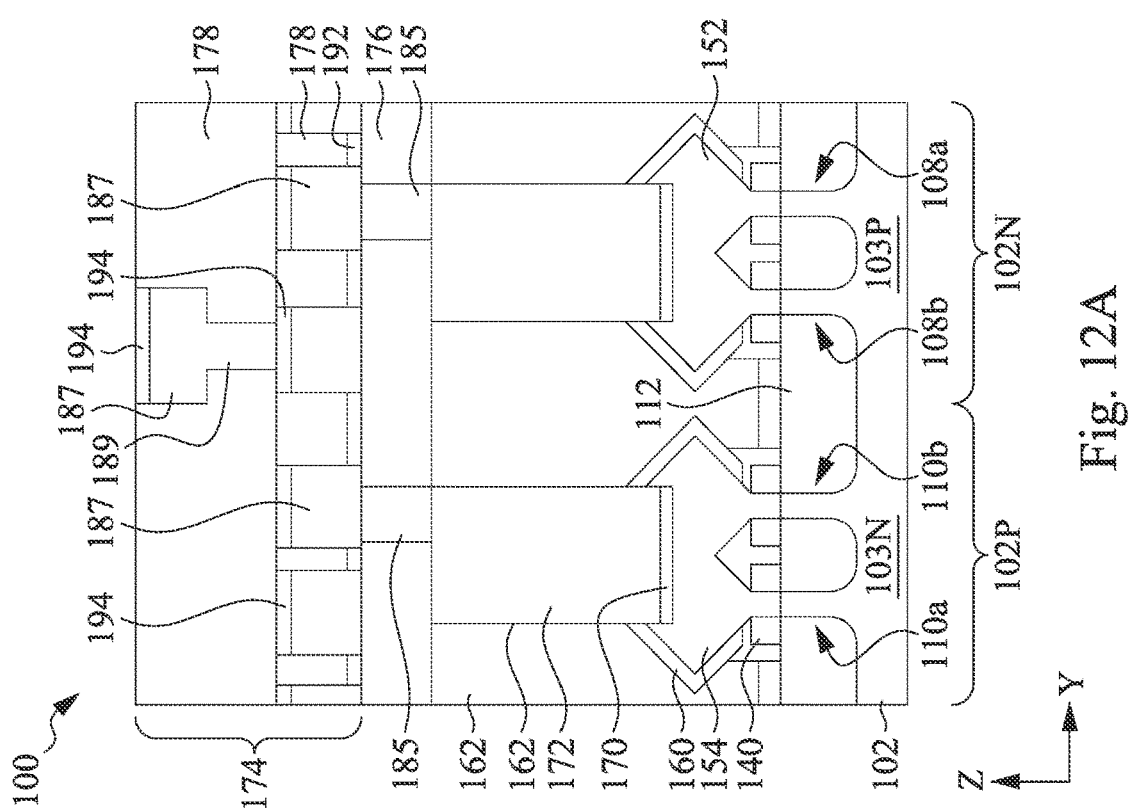
Figure 12C:
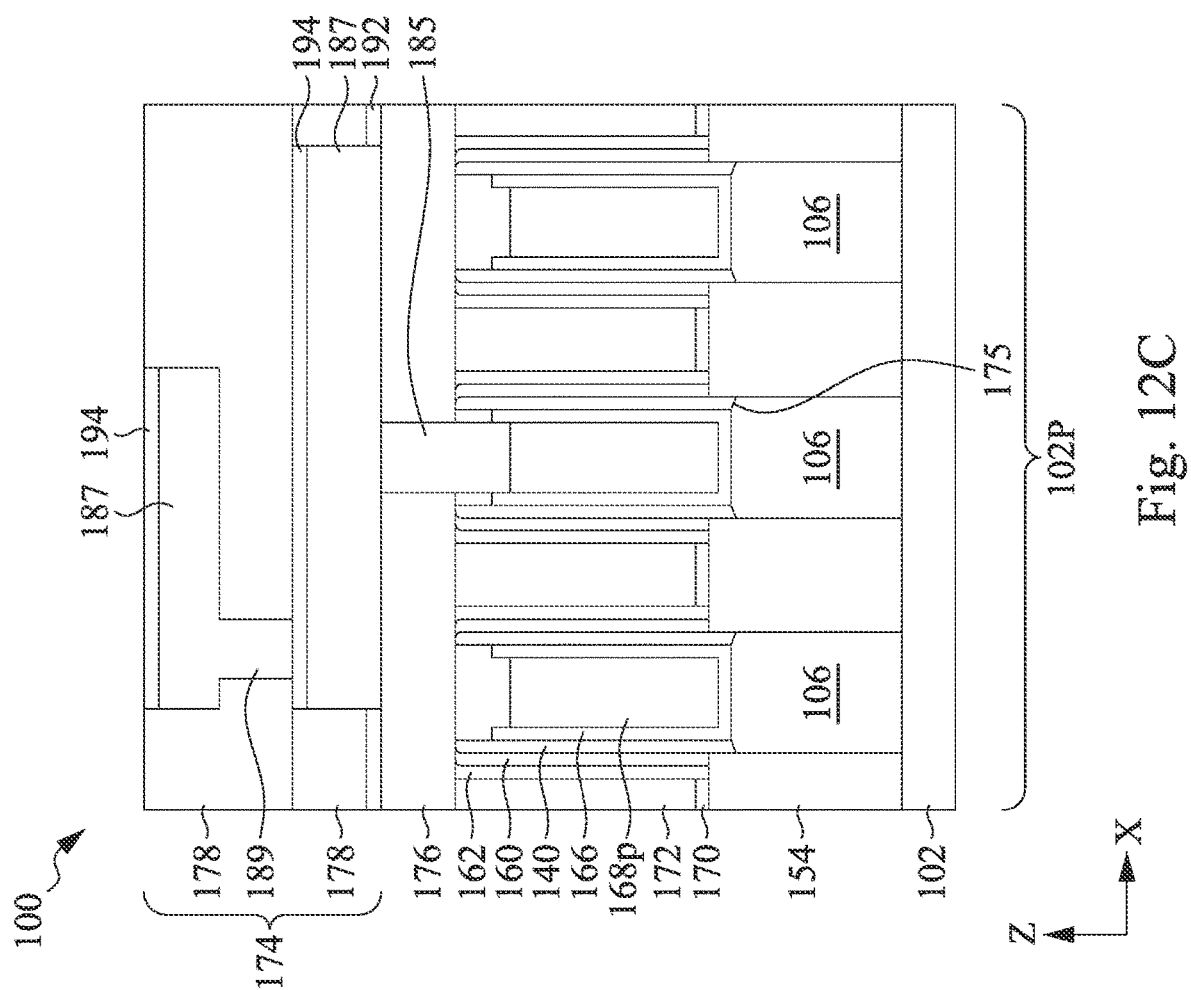

As shown in FIGS. 12A to 12C, a second ILD layer 176 may be formed over the first ILD layer 162. An annealing process may be performed after forming the second ILD layer 176 in order to improved physical properties, such as hardness or wet etch rate (WER), of the second ILD layer 176. The annealing process may be a thermal annealing process performed at a temperature less than about 450 degrees Celsius. Then, openings are formed in the second ILD layer 176 for conductive plugs 185 to be formed therein. The openings may be formed by an etch process, such as a dry etch or a wet etch process. Electric charge may be accumulated on the second ILD layer 176 as a result of the etch process. In order to remove the accumulated electric charge from the second ILD layer 176, the UV curing process is performed. The UV curing process may be the same UV curing process as described in FIG. 3. The UV curing process may be performed immediately after the etch process to remove the electric charge accumulated on the second ILD layer 176 while not substantially affecting the physical properties of the second ILD layer 176 and other materials of the semiconductor device structure 100. Next, the conductive plugs 185 are formed in the openings in the second ILD layer 176. The conductive plugs 185 may include any electrically conductive material, such as tungsten.

As shown in FIGS. 12A to 12C, an interconnect structure 174 is formed over the second ILD layer 176. The interconnect structure 174 may include one or more intermetal dielectric (IMD) layers and a plurality of interconnect features formed in each IMD layer. In one exemplary embodiment shown in FIGS. 12A to 12C, the interconnect structure 174 includes IMD layers 178 formed over the second ILD layer 176, and a plurality of conductive lines 187 and conductive vias 189 are embedded in the IMD layers 178. The conductive lines 187 and the conductive vias 189 may include or be formed of W, Ru, Co, Cu, Ti, TiN, Ta, TaN, Mo, Ni, or combinations thereof. In some embodiments, the conductive lines 187 and vias 189 includes Cu. The IMD layer 178 may be formed of the same material as the first ILD layer 162.

Next, an etch stop layer 192 is formed on the second ILD layer 176. The etch stop layer 192 may include the same material as the CESL 160. In some embodiments, the etch stop layer 192 is formed by PECVD or PEALD. After the PECVD pr PEALD process to form the etch stop layer 192, an average of negative 7.838 V of electric charge is accumulated on the etch stop layer 192. The electric charge accumulated on the etch stop layer 192 was not released after 40 hours. The UV curing process, such as the UV curing process described in FIG. 3, is performed to remove the electric charge accumulated on the etch stop layer 192. As a result of the UV curing process, the electric charge remains on the etch stop layer 192 dropped to negative 1.857 V. During processing, the UV curing process is performed immediately after the PECVD or PEALD process to form the etch stop layer 192.

Next, a first IMD layer 178 is formed on the etch stop layer 192. An annealing process may be performed after forming the first IMD layer 178 in order to improved physical properties, such as hardness or wet etch rate (WER), of the first IMD layer 178. The annealing process may be a thermal annealing process performed at a temperature less than about 450 degrees Celsius. Then, openings are formed in the first IMD layer 178 for the conductive lines 187 to be formed therein. The openings may be formed by an etch process, such as a dry etch or a wet etch process. Electric charge may be accumulated on the first IMD layer 178 as a result of the etch process. In order to remove the accumulated electric charge from the first IMD layer 178, the UV curing process is performed. The UV curing process may be the same UV curing process as described in FIG. 3. The UV curing process may be performed immediately after the etch process to remove the electric charge accumulated on the first IMD layer 178 while not substantially affecting the physical properties of the first IMD layer 178 and other materials of the semiconductor device structure 100.

Next, the conductive lines 187 are formed in the openings in the first IMD layer 178. A cap layer 194 is optionally formed on the conductive lines 187. The cap layer 194 includes an electrically conductive material, such as Cu, Co, Ru, Mo, Cr, W, Mn, Rh, Jr, Ni, Pd, Pt, Ag, Au, Al, alloys thereof, or other suitable material. The cap layer 194 may be formed by any suitable process, such as PVD, ALD, or PECVD. In some embodiments, the cap layer 194 includes Co and is formed by PECVD. After the PECVD process to form the Co cap layer 194, an average of negative 1.413 V of electric charge is accumulated on the first IMD layer 178. The UV curing process, such as the UV curing process described in FIG. 3, is performed after the formation of the Co cap layer 194 to remove the electric charge accumulated on the first IMD layer 178. As a result of the UV curing process, the electric charge remains on the IMD layer 178 dropped to negative 0.182 V.

The interconnect structure 174 may include additional IMD layers 178 and conductive lines 187 and vias 189 formed over the first IMD layer 178, as shown in FIGS. 12A to 12C. In some embodiments, the conductive line 187 and via 189 are formed by a dual damascene process, and the cap layer 194 is not formed on the conductive via 189. In some embodiments, the conductive line 187 and via 189 are formed by a single damascene process, and the cap layer 194 is formed on both the conductive line 187 and the conductive via 189. Each time a plasma deposition process, a plasma etch process, or a wet etch process is performed, the UV curing process is performed in order to remove electric charge accumulated on the exposed dielectric materials. By removing the electric charge accumulated on the dielectric materials, under etch and reduced time-dependent dielectric breakdown (TDDB) may be avoided.

The present disclosure provides methods of forming the semiconductor device structure 100. In some embodiments, the method includes performing an UV curing process after a plasma process or a wet etch process. The UV curing process removes electric charge accumulated on dielectric materials of the semiconductor device structure 100, leading to improved TDDB.

An embodiment is a method. The method includes forming an interconnect structure over a substrate. The forming the interconnect structure over the substrate includes forming a dielectric layer, then performing an annealing process, then forming one or more openings in the dielectric layer, then performing a first ultraviolet (UV) curing process, and then forming conductive features in the one or more openings.

Another embodiment is a method. The method includes forming one or more semiconductor fins, forming an insulating structure to embed the one or more semiconductor fins, performing an annealing process, recessing the insulating structure, removing electric charge accumulated on the insulating structure by performing a first ultraviolet (UV) curing process, and forming one or more sacrificial gate structures.

A further embodiment is a method. The method includes forming an insulating structure over a substrate, performing a first annealing process, recessing the insulating structure, performing a first ultraviolet (UV) curing process, forming source/drain epitaxial features over the substrate, forming a gate electrode layer over the substrate, forming a dielectric layer over the source/drain epitaxial features and the gate electrode layer, performing a second annealing process, forming one or more openings in the dielectric layer, performing a second UV curing process, and forming conductive features in the one or more openings.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method, comprising:
   forming an interconnect structure over a substrate, comprising:
   forming a dielectric layer;
   forming an opening in the dielectric layer;
   forming a conductive feature in the opening;
   forming a cap layer on the conductive feature, wherein the cap layer comprises a metal and is formed by a plasma enhanced chemical vapor deposition process; and then
   performing a first ultraviolet (UV) curing process immediately after forming the cap layer, wherein electric charge accumulated on the dielectric layer as a result of the plasma enhanced chemical vapor deposition process is removed by the first UV curing process.

2. The method of claim 1, wherein the first UV curing process comprises exposing the cap layer to a first UV light having a wavelength ranging from about 200 nm to about 400 nm.

3. The method of claim 2, wherein a processing temperature of the first UV curing process ranges from about 70 degrees Celsius to about 400 degrees Celsius.

4. The method of claim 3, wherein a processing pressure of the first UV curing process ranges from about 1 Torr to about 10 Torr.

5. The method of claim 1, wherein the opening is formed by a dry etch process or a wet etch process.

6. The method of claim 5, further comprising performing a second UV curing process after forming the opening in the dielectric layer.

7. The method of claim 6, wherein the second UV curing process comprises exposing the dielectric layer to a second UV light having a wavelength ranging from about 200 nm to about 400 nm.

8. The method of claim 1, wherein the cap layer comprises cobalt.

9. A method, comprising:
   forming a semiconductor fin;
   forming an insulating structure to embed the semiconductor fin;
   performing an annealing process;
   recessing the insulating structure to form a shallow trench isolation (STI) region, wherein the recessing the insulating structure is performed by a wet etch process; then
   performing a first ultraviolet (UV) curing process on the STI region; and
   forming a sacrificial gate structure over the semiconductor fin.

10. The method of claim 9, wherein the first UV curing process comprises exposing the STI region to an UV light having a wavelength ranging from about 200 nm to about 400 nm.

11. The method of claim 10, wherein a processing temperature of the first UV curing process ranges from about 70 degrees Celsius to about 400 degrees Celsius.

12. The method of claim 11, wherein a processing pressure of the first UV curing process ranges from about 1 Torr to about 10 Torr.

13. The method of claim 9, wherein the forming the sacrificial gate structure comprises:
   forming a sacrificial gate dielectric layer;
   forming a sacrificial gate electrode layer; and
   removing portions of the sacrificial gate dielectric layer and portions of the sacrificial gate electrode layer to expose portions of the STI region.

14. The method of claim 13, further comprising performing a second UV curing process after exposing the portions of the STI region.

15. The method of claim 14, further comprising recessing portions of the semiconductor fin not covered by the sacrificial gate structure.

16. The method of claim 15, further comprising performing a third UV curing process after the recessing the portions of the semiconductor fin not covered by the sacrificial gate structure.

17. A method, comprising:
   forming an insulating structure over a substrate;
   recessing the insulating structure;
   performing a first ultraviolet (UV) curing process;
   forming source/drain epitaxial features over the substrate;
   forming a gate electrode layer over the substrate;
   forming a dielectric layer over the source/drain epitaxial features and the gate electrode layer;
   forming an opening in the dielectric layer;
   performing a second UV curing process;
   forming a conductive feature in the opening;
   forming a cap layer on the conductive feature by a plasma enhanced chemical vapor deposition process, wherein the cap layer comprises a metal; and
   performing a third UV curing process immediately after forming the cap layer, wherein electric charge accumulated on the dielectric layer as a result of the plasma enhanced chemical vapor deposition process is removed by the third UV curing process.

18. The method of claim 17, wherein the first UV curing process comprises exposing the insulating structure to an UV light having a wavelength ranging from about 200 nm to about 400 nm.

19. The method of claim 17, wherein the second UV curing process is performed to remove electric charge accumulated on the dielectric layer.

20. The method of claim 17, wherein the cap layer comprises cobalt.

* * * * *